(12) United States Patent
Ausserlechner

(10) Patent No.: US 9,476,915 B2
(45) Date of Patent: Oct. 25, 2016

(54) MAGNETIC FIELD CURRENT SENSORS

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 997 days.

(21) Appl. No.: 12/963,787

(22) Filed: Dec. 9, 2010

(65) Prior Publication Data

US 2012/0146164 A1    Jun. 14, 2012

(51) Int. Cl.
| | | |
|---|---|---|
| H01L 29/82 | (2006.01) |
| G01R 33/00 | (2006.01) |
| G01R 15/20 | (2006.01) |
| G01R 33/07 | (2006.01) |
| H01L 23/00 | (2006.01) |
| H01L 43/06 | (2006.01) |

(52) U.S. Cl.
CPC ........... *G01R 15/202* (2013.01); *G01R 33/072* (2013.01); *H01L 24/34* (2013.01); *H01L 43/06* (2013.01); *H01L 2224/37147* (2013.01); *H01L 2224/48091* (2013.01); *H01L 2924/10253* (2013.01); *H01L 2924/14* (2013.01); *H01L 2924/181* (2013.01)

(58) Field of Classification Search
CPC .................. H01L 43/06; H01L 24/34; H01L 2224/37147
USPC ........................................ 257/415, 421, 433
See application file for complete search history.

(56) References Cited

U.S. PATENT DOCUMENTS

| | | |
|---|---|---|
| 4,894,610 A | 1/1990 | Friedl |
| 5,017,804 A | 5/1991 | Harnden |
| 5,041,780 A | 8/1991 | Rippel |
| 5,173,758 A | 12/1992 | Heremans |
| 5,786,976 A | 7/1998 | Field |
| 5,963,028 A * | 10/1999 | Engel et al. ............... 324/207.2 |

(Continued)

FOREIGN PATENT DOCUMENTS

| | | |
|---|---|---|
| DE | 19821492 | 11/1999 |
| DE | 10233129 A1 | 2/2003 |

(Continued)

OTHER PUBLICATIONS

Application and File History of U.S. Appl. No. 12/630,596, Inventor: Ausserlechner et al., filed Dec. 3, 2009.

(Continued)

*Primary Examiner* — Ori Nadav
(74) *Attorney, Agent, or Firm* — Schiff Hardin LLP

(57) ABSTRACT

Embodiments relate to magnetic field current sensors. In an embodiment, a magnetic field current sensor includes a semiconductor die having first and second opposing surfaces and comprising at least one magnetic field sensing element; and a unitary conductor comprising a footprint portion, first and second pillar portions, and first and second contact portions, the first pillar portion having a first height and coupling the first contact portion to the footprint portion, the second pillar portion having the first height and coupling the second contact portion to the footprint portion, the first height being a monotonic vertical dimension separating the footprint portion from the first and second contact portions, and the footprint portion coupling the conductor to the first surface of the die such that the footprint portion is substantially parallel to the first surface of the die and within a perimeter of the first surface and the first and second contacts portions are closer to the first surface than the second surface.

18 Claims, 31 Drawing Sheets

(56) References Cited

U.S. PATENT DOCUMENTS

| | | |
|---|---|---|
| 6,341,416 B1 | 1/2002 | Biskeborn |
| 6,356,068 B1* | 3/2002 | Steiner et al. ............ 324/117 H |
| 6,424,018 B1 | 7/2002 | Ohtsuka |
| 6,462,531 B2 | 10/2002 | Ohtsuka |
| 6,683,448 B1 | 1/2004 | Ohtsuka |
| 6,727,683 B2 | 4/2004 | Goto |
| 6,781,313 B2 | 8/2004 | Aiken |
| 6,841,989 B2 | 1/2005 | Goto |
| 6,940,265 B2 | 9/2005 | Hauenstein |
| 6,949,927 B2 | 9/2005 | Goetz |
| 6,995,315 B2 | 2/2006 | Sharma |
| 7,075,287 B1 | 7/2006 | Mangtani |
| 7,129,691 B2 | 10/2006 | Shibahara |
| 7,166,807 B2 | 1/2007 | Gagnon |
| 7,259,545 B2 | 8/2007 | Stauth |
| 7,375,507 B2 | 5/2008 | Racz |
| 7,474,093 B2 | 1/2009 | Ausserlechner |
| 7,476,816 B2 | 1/2009 | Doogue |
| 7,476,953 B2 | 1/2009 | Taylor |
| 7,816,905 B2 | 10/2010 | Doogue |
| 8,159,254 B2 | 4/2012 | Kaltalioglu |
| 2001/0052780 A1 | 12/2001 | Hayat-Dawoodi |
| 2008/0035923 A1 | 2/2008 | Tschmelitsch |
| 2008/0297138 A1 | 12/2008 | Taylor |
| 2009/0026560 A1* | 1/2009 | Wombacher et al. ........ 257/415 |
| 2009/0050990 A1 | 2/2009 | Aono |
| 2009/0058412 A1 | 3/2009 | Taylor |
| 2009/0294882 A1* | 12/2009 | Sterling ........................ 257/427 |
| 2010/0156394 A1 | 6/2010 | Ausserlechner et al. |
| 2011/0133732 A1* | 6/2011 | Sauber ......................... 324/251 |
| 2011/0204887 A1 | 8/2011 | Ausserlechner et al. |
| 2011/0234215 A1 | 9/2011 | Ausserlechner |
| 2011/0304327 A1 | 12/2011 | Ausserlechner |
| 2012/0049884 A1 | 3/2012 | Kaltalioglu |
| 2012/0112365 A1 | 5/2012 | Ausserlechner |
| 2012/0146165 A1 | 6/2012 | Ausserlechner et al. |

FOREIGN PATENT DOCUMENTS

| | | |
|---|---|---|
| DE | 10231194 | 2/2004 |
| DE | 19946935 | 2/2004 |
| WO | WO 01/23899 A1 | 4/2001 |
| WO | WO 2005/033718 A1 | 4/2005 |
| WO | WO 2008/008140 | 1/2008 |
| WO | WO 2009/088767 | 9/2009 |

OTHER PUBLICATIONS

Steiner et al., "Fully Packaged CMOS Current Monitor Using Lead-On-Chip Technology," *Physical Electronics Laboratory*, pp. 603-608, © 1998.

Lutz et al., "Double-Sided Low-Temperature Joining Technique for Power Cycling Capability at High Temperature," EPE 2005-Dresden, ISBN: 90-75815-08-5.

Schwarzbauer et al., "Novel Large Area Joining Technique for Improved Power Device Performance," *IEEE Transactions on Industry Applications*, vol. 27, No. 1, pp. 93-95, 1991.

Application and File History of U.S. Appl. No. 12/963,817, Inventor: Ausserlechner et al., filed Dec. 9, 2010.

Application and File History of U.S. Appl. No. 12/711,471, Inventor: Ausserlechner et al., filed Feb. 24, 2010.

Application and File History of U.S. Appl. No. 12/813,218, Inventor: Ausserlechner, filed Jun. 10, 2010.

Hopkins, Allegro MicroSystems, Inc., High-Performance Power ICs and Hall-Effect Sensors, "Hall Effect Technology for Server, Backplane and Power Supply Applications", IBM 2008 Power and Cooling Symposium, Sep. 30, 2008, 34 pages.

Allegro, Allegro Hall Effect-Based Current Sensor ICs: Revolutionary, high accuracy, high bandwidth current sensing!, www.allegromicro.com/en/Products/Design/curren_sensors/index.asp, 5 pages, © 2010.

Allegro, *Hall-Effect Sensor IC's: Current Sensor ICs*, 1 page, © 2010.

Allegro, High Bandwidth, Fast Fault Response Current Sensor IC In Thermally Enhanced Package, ACS709-DS, www.microallegro.com, 16 pages, © 2008-2009.

Allegro, Fully Integrated, Hall Effect-Based Linear Current Sensor IC with 2.1 kVRMS Isolation and a Low-Resistance Current Conductor, ACS712-DS, Rev. 13, 14 pages, © 2006-2010.

Sandireddy, Sandhya, IEEE Xplore, © 2005, Advanced Wafer Thinning Technologies to Enable Multichip Packages, pp. 24-27.

Application and File History for U.S. Appl. No. 13/086,566, filed Apr. 14, 2011, inventor: Udo Ausserlechner.

* cited by examiner

MAGNETIC FIELD CURRENT SENSORS

TECHNICAL FIELD

The invention relates generally to integrated circuits and more particularly to integrated circuit magnetic current sensors.

BACKGROUND

Desired properties of galvanically isolated integrated circuit (IC) magnetic field current sensors include high magnetic sensitivity; high mechanical stability and reliability; low stress influence to Hall sensor elements near chip borders; high thermal uniformity and low thermal gradients; high isolation voltage; minimized electromigration issues; and low manufacturing costs. Conventional current sensors can include one or more features or be manufactured in ways that aim to address these desired properties.

For example, some current sensors use the leadframe as a current lead. Others also include a magnetic core. Such sensors, however, can be expensive to manufacture.

Other current sensors include additional layers, such as special magnetic layers on top of the silicon die or a thick metal layer formed on the isolation layer. These sensors are also expensive, and the former can be sensitive to disturbance fields and can suffer from drawbacks related to the positioning of the current leading wire outside of the IC.

Therefore, there is a need for a galvanically isolated IC magnetic field current sensor having desired properties while minimizing drawbacks.

SUMMARY

In an embodiment, a magnetic field current sensor comprises a semiconductor die having first and second opposing surfaces and comprising at least one magnetic field sensing element; and a unitary conductor comprising a footprint portion, first and second pillar portions, and first and second contact portions, the first pillar portion having a first height and coupling the first contact portion to the footprint portion, the second pillar portion having the first height and coupling the second contact portion to the footprint portion, the first height being a monotonic vertical dimension separating the footprint portion from the first and second contact portions, and the footprint portion coupling the conductor to the first surface of the die such that the footprint portion is substantially parallel to the first surface of the die and within a perimeter of the first surface and the first and second contacts portions are closer to the first surface than the second surface.

In an embodiment, a magnetic field current sensor comprises a die having at least one magnetic field sensing element; a plurality of contacts disposed in a first plane and coupled to the die; a conductor comprising first and second contact portions, the first and second contacts electrically coupled and disposed in a second plane different from the first plane, and the conductor coupled to and electrically isolated from the die; and a mold body enclosing the die, the plurality of contacts, and the first and second contact portions.

BRIEF DESCRIPTION OF THE DRAWINGS

The invention may be more completely understood in consideration of the following detailed description of various embodiments of the invention in connection with the accompanying drawings, in which.

Figure 1:
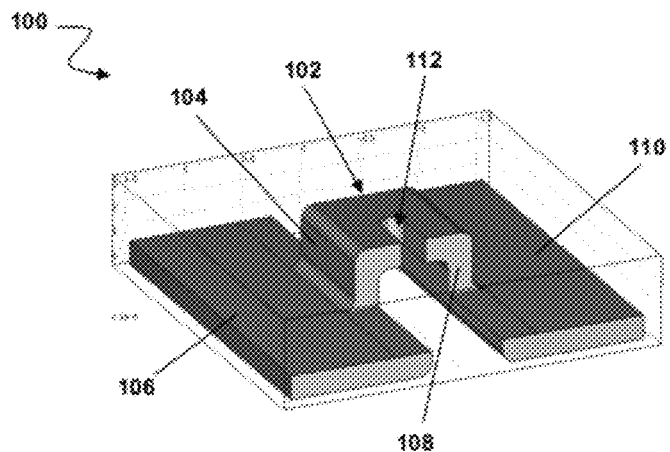
FIG. 1 depicts a current conductor clip according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The invention relates to an IC magnetic field current sensor having a three-dimensional current conductor. In embodiments, three-dimensional conductors can avoid long lateral dimensions that increase internal resistance and can also be positioned closer to the die in order to maximize the magnetic field at sensor element locations. Additionally, a three-dimensional current conductor fabricated from a single piece can reduce or eliminate electromigration issues. Embodiments can also keep the resistance low, such as on the order of about 100 µΩ in one embodiment, and provide good galvanic isolation, such as up to about 10 kV in embodiments. Embodiments can also include current contacts and low-voltage sensor pins arranged on different levels. Embodiments can thereby provide significant voltage isolation at relatively low cost.

FIG. 1 depicts a current conductor clip 100 according to an embodiment. In an embodiment, clip 100 comprises a central or footprint portion 102, a first pillar portion 104, a first contact 106, a second pillar portion 108 and a second contact 110.

In an embodiment, footprint portion 102 comprises one or more notches 112. Notch 112 can be configured in size, shape and/or position to shape and amplify current flow through clip 100 and near magnetic field sensors. In the embodiment of FIG. 1, notch 112 is about 0.3 mm by about 0.5 mm. As depicted, the internal end of notch 112 is rounded, though this can vary in other embodiments. In other embodiments, notch 112 can be longer or shorter, narrower or wider, non-symmetric, can comprise an aperture through footprint portion 102, or can have some other configuration.

Footprint portion 102 is generally sized and shaped such that it is large enough to make good mechanical contact with a die on which it is mounted and also to support clip 100 during manufacturing without causing it to tip or fall, while remaining smaller than the die as clip 100 should be placed a sufficient lateral distance from the sawing edge of the die in order to achieve a desired or required voltage isolation. In embodiments, the voltage isolation is in a range of about 1 kV to about 10 kV, with footprint portion 102 separated from the sawing edge of the die by about 0.1 mm to about 1 mm. As depicted in FIG. 1, footprint portion 102 is about 1 mm by about 1 mm. If a die on which it is mounted is about, for example, 2.7 mm by about 2.7 mm, and clip 100 is mounted in the approximate center, the lateral distance between footprint portion 102 and the sawing edge of the die is about 0.85 mm. Thus, with appropriate mold compound on top of the die, the distance is sufficient to withstand voltages up to about 10 kV.

First and second pillar portions 104 and 108 couple footprint portion 102 to first and second contacts 106 and 110, respectively and are at approximately right angles to footprint portion 102 and contacts 106 and 110. In embodiments, first and second pillar portions 104 and 108 are of a monotonic height such that they separate the first and second contacts 106 110, respectively, from the footprint portion by a vertical distance and are long enough to provide a sufficient distance between contacts 106 and 110 and the sawing edge of the die because one or both of contacts 106 and 110 can overlap with the sawing edge without unnecessarily increasing the current path length in clip 100. With respect to the monotonic nature of the first and second pillar portions 104 and 108, clip 100 extends from contacts 106 and 110 to footprint portion 102 only in a single direction, without reversing direction or bending up and then down. In other words, if contacts 106 and 110 are at a first height and footprint portion 102 is at a second height, then a function which describes the height versus lateral dimensions is monotonic in a mathematical sense, meaning that its derivative does not change sign.

In the embodiment of FIG. 1, the overall height of clip 100 is about 0.7 mm, with the thickness being about 0.2 mm. Thus, the vertical distance between contacts 106 and 110 and the sawing edge of the die on which clip 100 is mounted (which is not shown in FIG. 1) is about 0.5 mm. The height of clip 100 should not be too large, however, because this can increase the resistance of clip 100 and consequently the influence the power dissipation and temperature.

Contacts 106 and 110 are identical in an embodiment. Contacts 106 and 100 should be large enough to offer a sufficient surface and, desirably, be larger than the die. Thus, as depicted in FIG. 1, contacts 106 and 110 can overlap the sawing edge of the die (not depicted) and are about 3 mm by about 1.2 mm As previously mentioned, the thickness of clip 100 in FIG. 1 is about 0.2 mm. Clip 100 should be thick enough to ensure mechanical stability during assembly and during subsequent operation of the device. A thicker clip also reduces the internal resistance of the clip. On the other hand, the thickness of clip 100 is limited by the manufacturability of the clip: clip 100 is punched and pressed, bent or otherwise formed into shape and needs to be done so with reasonable accuracy, which limits the overall thickness. Further, if clip 100 comprises notch 112, the width of notch 112 typically is equal to or greater than the thickness of clip 100, regardless of whether notch 112 is formed by punching, etching or some other methodology. Thus, clip 100 is about 0.2 mm thick in the embodiment of FIG. 1, which the same as the width of notch 112 as depicted. For large current ranges, however, clip 100 need not include notch 112, and the omission of notch 112 can simplify manufacturing and allow for thicker clips, such as up to about 1 mm or more in embodiments.

In general, clip 100 comprises a material that is a good electrical and thermal conductor and nonmagnetic, such as having ferromagnetic impurities that are less than 0.1%. It is helpful for the material to be soft enough to facilitate punching, forming, pressing, trimming and other steps during manufacturing. In one embodiment, clip 100 comprises copper. In another embodiment, clip 100 comprises aluminum.

Figure 2A:
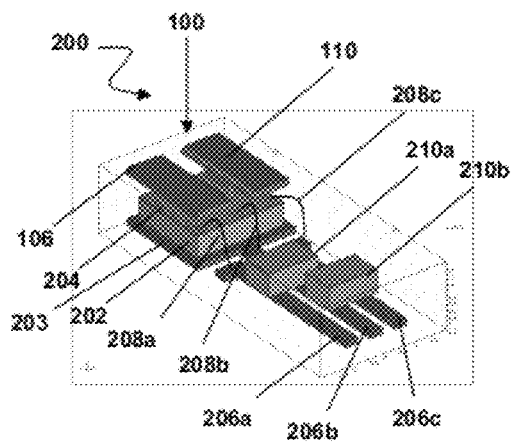
FIG. 2A depicts sensor components according to an embodiment.
Figure 2B:
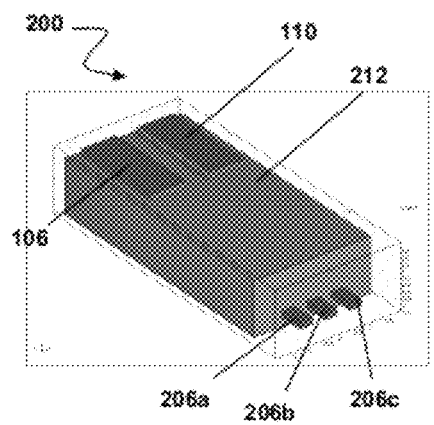
FIG. 2B depicts a sensor package according to an embodiment.

FIG. 2 depicts a sensor package 200 comprising clip 100. FIG. 2A depicts package 200 before molding, while FIG. 2B depicts package 220 after molding.

In FIG. 2A, clip 100 is coupled is coupled to a die 202, which in turn is coupled to a base plate or die paddle 203. In embodiments, die 202 is coupled to die paddle 203 by an adhesive, solder paste or some other suitable means. Die paddle 203 is a conductive base plate, and because the magnetic field in clip 100 can induce eddy currents in the die paddle, die 202 is made as thick as possible in an embodiment to maximize the distance between clip 100 and die paddle 203. As depicted, clip 100 is coupled to a top of die 202, though in other embodiments the bottom of die 202 can be used. In an embodiment, a galvanic isolation layer 204 is between clip 100 and die 202. Also depicted in FIG. 2A are signal output, ground and supply voltage reference pins 206a, 206b and 206c and related bond wires 208a, 208b and 208c, as well as two capacitors: 210a between signal pin 206a and ground pin 206b, and 210b between ground pin 206b and supply pin 206c.

In FIG. 2B, sensor package 200 is depicted after molding. A mold body 212 encloses the components of sensor package 200, with contacts 106 and 110 and sensor pins 206a, 206b and 206c remaining external to mold body 212.

Figure 3A:
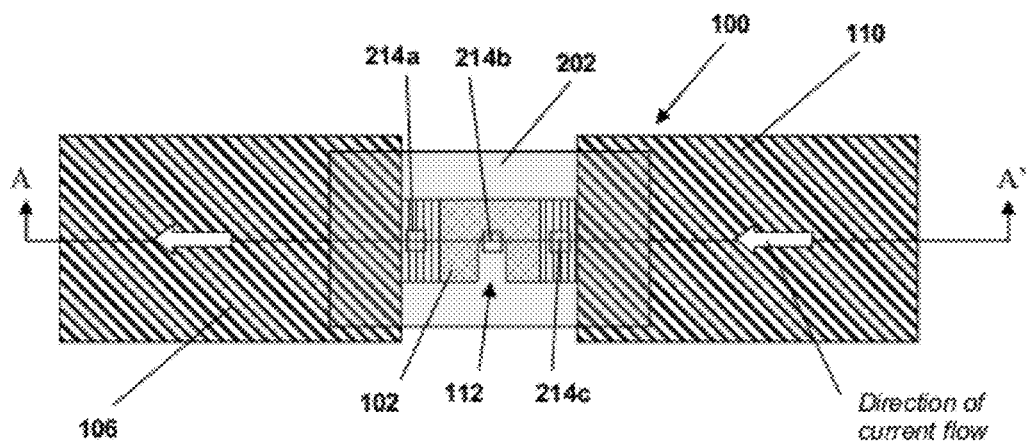
FIG. 3A depicts a top view of sensor components according to an embodiment.
Figure 3B:
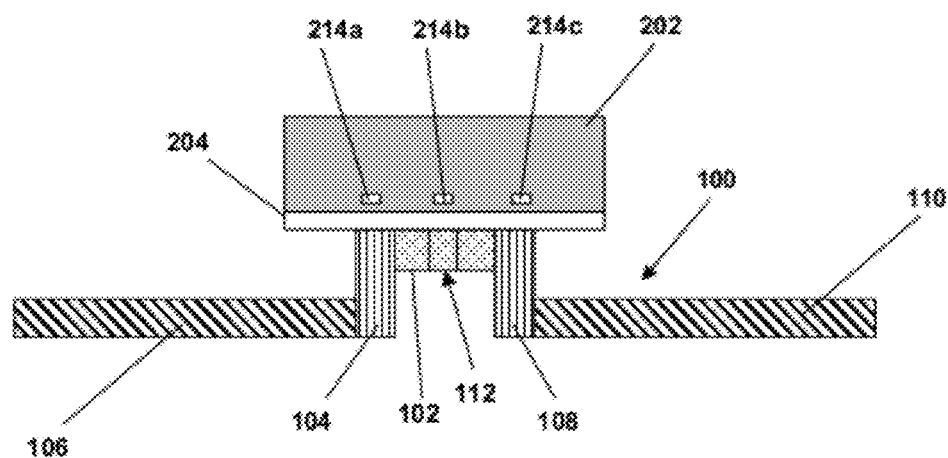
FIG. 3B depicts a side sectional view of the sensor components of FIG. 3A.

FIG. 3 depicts clip 100 and die 202. FIG. 3A is a top plan view, and FIG. 3B is a cross-sectional view taken along A-A' shown in FIG. 3A. Die 202 includes a plurality of magnetic field sensors 214a, 214b and 214c. In an embodiment, magnetic field sensors 214a, 214b and 214c are Hall plates, which are sensitive to the magnetic field component perpendicular to the surface of die 202. The active volume of sensors 214a, 214b and 214c is typically about 20 µm to about 200 µm in length and width and less than about 10 µm thick, such as about 3 µm in an embodiment. To remove offset, a spinning current technique is utilized, such as with Hall plates having geometries that are 90 degrees symmetric.

Magnetic field sensors 214a, 214b and 214c are positioned on die 202 at locations which the current through clip 100 experiences extreme values, for example along the boundary of clip 100. If clip 100 comprises one or more notches 112, an optimum position for a magnetic field sensor 214a, 214b and/or 214c is adjacent an end of notch 112, as notch 112 causes strongly inhomogeneous current density and consequently the magnetic field is more effectively localized near an end thereof. More information regarding notch 112 and this effect can be found in co-owned U.S. patent application Ser. No. 12/711,471, which is incorporated herein by reference in its entirety.

If the distance between the active volume of magnetic field sensors 214a, 214b and 214c and the opposing surface of clip 100 is small, such as about 5 µm to about 50 µm in embodiments, half of the active volume should overlap clip 100 in an embodiment. In another embodiment comprising notch 112, the active volume can be positioned predominantly or entirely adjacent notch 112, such that only a small part or no part of magnetic field sensor 214a, 214b and/or 214c overlaps the conductive material of clip 100.

To remove undesirable background magnetic field effects on magnetic field sensors 214a, 214b and 214c, higher order differential field measurements can be used, such as are described in co-owned U.S. patent application Ser. No. 12/630,596, which is incorporated herein by reference in its entirety. In essence, magnetic field sensors 214a, 214b and 214c need not each be located at magnetic field extremes, though it can be advantageous for each to experience a strong magnetic field. This is not always possible, however, absent complicated chip design and increased ohmic resistance of clip 100. Therefore, another viable option is to position less than all magnetic field sensors 214a, 214b and 214c at points of maximum field from current through clip 100. Such a configuration is the one depicted in FIG. 3, with magnetic field sensor 214b positioned with respect to the end of notch 112 and magnetic field sensors 214a and 214c positioned on either side thereof, after and before sensor 214b with respect to the direction of current flow in clip 100.

Figure 4A:
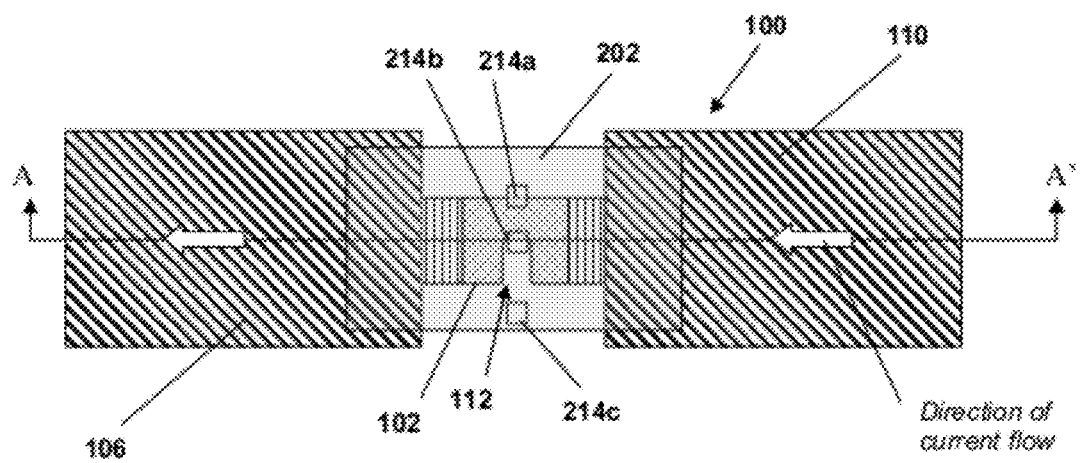
FIG. 4A depicts a top view of sensor components according to an embodiment.
Figure 4B:
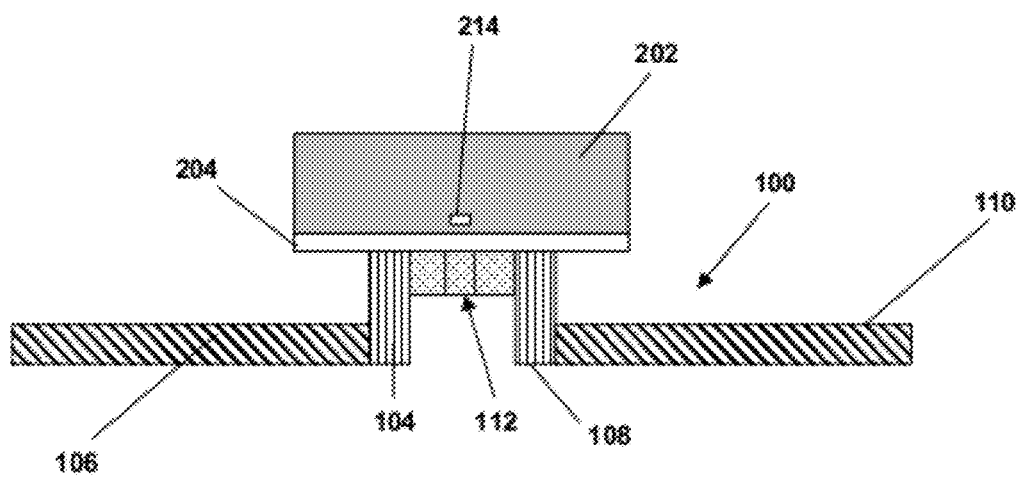
FIG. 4B depicts a side sectional view of the sensor components of FIG. 4A.

FIG. 4 depicts another embodiment of clip 100 and die 202, in which the axis of magnetic field sensors 214a, 214b and 214c is rotated 90 degrees on the surface of die 202. As can be seen in FIG. 4A, the distance between magnetic field sensors 214a and 214b is less than the distance between magnetic field sensors 214b and 214c. In embodiments, these distances can be chosen arbitrarily so that the positions of magnetic field sensors 214a, 214b and 214c match with one or several locations of strong or extreme magnetic field due to current in clip 100.

Figure 5A:
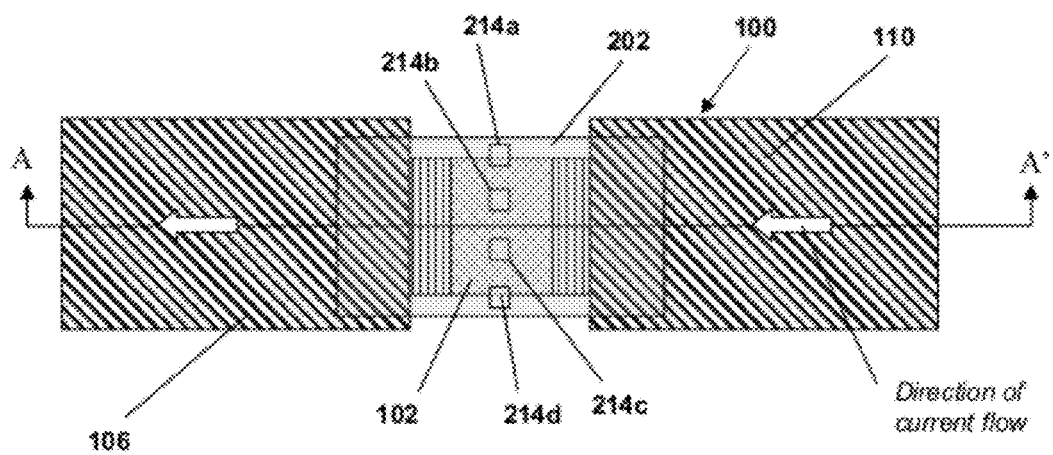
FIG. 5A depicts a top view of sensor components according to an embodiment.
Figure 5B:
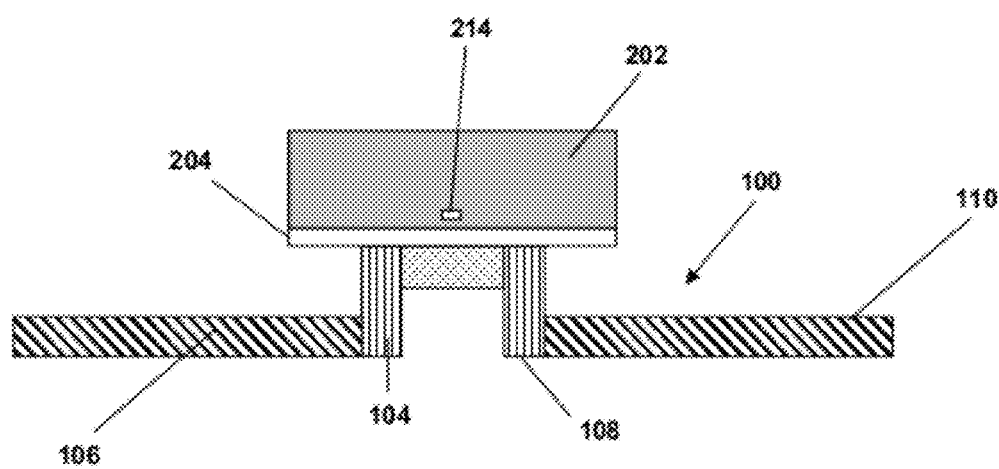
FIG. 5B depicts a side sectional view of the sensor components of FIG. 5A.

For compatibility with higher current ranges, clip 100 omits notch 112 which increases the resistance of clip 100, as depicted in FIG. 5. The configuration of magnetic field sensors 214a, 214b and 214c is similar to that of the embodiment depicted in FIG. 4 but with the addition of a fourth magnetic field sensor 214d. Two magnetic field sensors 214b and 214c are arranged near the middle of clip 100, and the signals of magnetic field sensors 214a, 214b, 214c and 214d can be combined as follows:

$$\text{Total signal} = (d-a) - 3*(c-b)$$

where a refers to the signal of magnetic field sensor 214a, b refers to the signal of magnetic field sensor 214b, etc., and the magnetic field sensors 214a, 214b, 214c and 214d are equidistantly spaced.

If magnetic field sensors 214a, 214b, 214c and 214d are not equidistantly spaced, each signal is then multiplied by an appropriate scaling factor, such as is described in previously mentioned U.S. patent application Ser. No. 12/630,596, which has been incorporated herein by reference.

As can be seen, at least one advantage relates to the versatility of embodiments of clip 100 and the package concept. Small changes in the thickness, width, notch geometry and/or other characteristics of clip 100 can adjust or customize the resistance of clip 100. Further, as illustrated by FIGS. 3-5 in particular, the number and configuration of the magnetic field sensors can also be customized for signal processing, such as by selecting the desired sensor or sensors by dedicated metal masks, fusible links, zener zapping, memory such as EEPROM, or in some other suitable way. The isolation hardness may also be adjusted. For example, for low isolation requirements, such as for about 1 kV, inexpensive layers like polyimide can be used. For more moderate isolation, such as about 4 kV, thicker polyimide or thin nitrides or oxides can be used. For maximum isolation, such as up to about 10 kV, silicon dioxide, such as about 15 µm thick in an embodiment, can be used. In general, therefore, it is possible to manufacture an entire family of current sensors with full scale current ranges of, for example, about 5 A to about 500 A, at very low cost.

Figure 6:
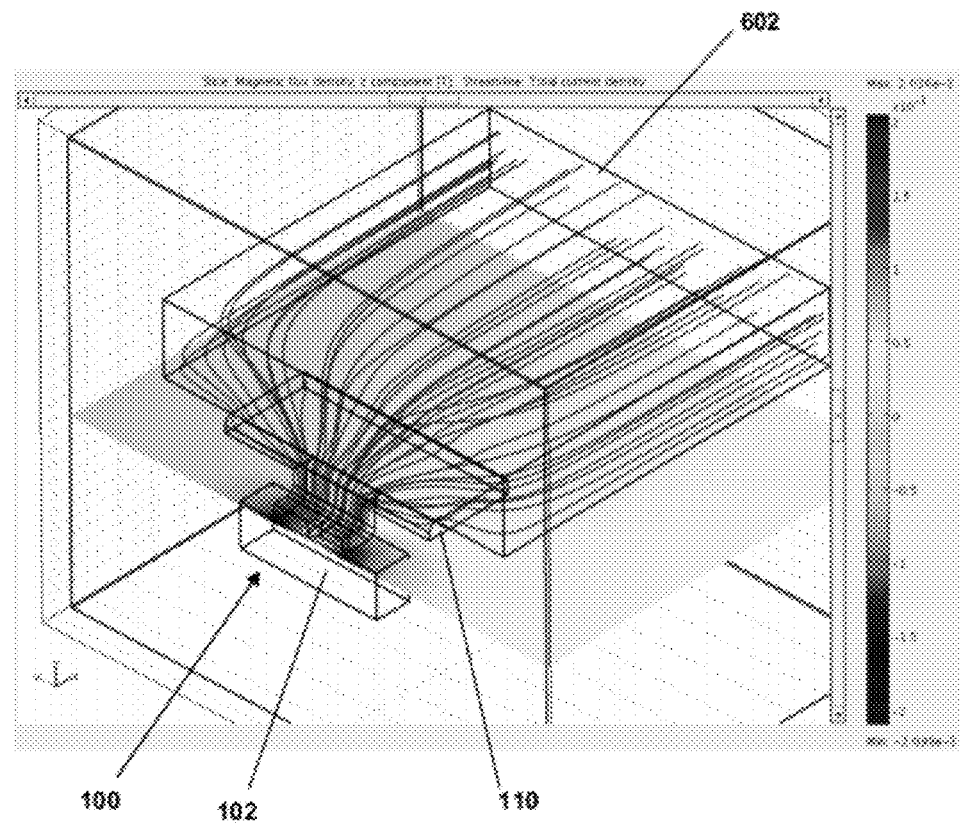
FIG. 6 depicts simulation results in a partial view of a current conductor clip according to an embodiment.

FIG. 6 depicts simulation results for an embodiment of clip 100. Only half of clip 100 is depicted, and notch 112 is omitted in this embodiment. Clip 100, which comprises copper, is coupled to a bus bar 602, which is about 5 mm wide by about 1 mm thick. The narrow portion of clip 100 is about 1 mm wide and about 0.2 mm thick, current streamlines therethrough are shown in FIG. 6. 0 V is defined at the left side of clip 100, while 0.5 mV is defined at the right side of bus bar 602, and the current is 5.5365 A. Power dissipated by clip 100 is 4.2556 mW, and the resistance of clip 100 in the embodiment of FIG. 6 is 140 µΩ. The magnetic flux density 50 µm below clip 100 is about 2.05 mT, or about 370 µT/A. At a full current range of 75 A, the magnetic field (B) is about 27.8 mT at each side of clip 100. FIG. 6 depicts the Bz field at z=−50 µm. The bottom surface of clip 100 is at z=0 mm. Magnetic field sensors, such as Hall elements, would be positioned about 20 µm to about 50 µm below this point in an embodiment.

Figure 7:
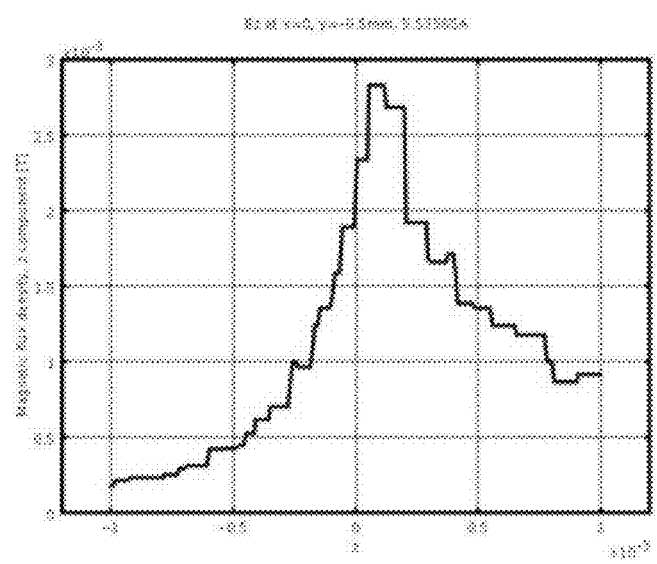
FIG. 7 depicts simulation results of magnetic field versus z-position of the conductor clip of FIG. 6.

FIG. 7 depicts the decline of the magnetic field versus z-position near the edge of clip 100 (i.e., at about y=−0.5 mm). For example, if z changes by about 0.1 mm, the magnetic field decreases from about 2 mT to about 1.5 mT, or about 0.3%/µm. If the adhesive layer and thickness of clip 100 change, such as due to temperature changes or humidity, so too can the vertical distance change, possibly leading to errors in the calibration of the current sensor. Because the absolute value of the thicknesses is also small, however, any percentage change will be correspondingly small. Therefore, material expansion is not a significant problem in view of the thin layers used.

Figure 8:
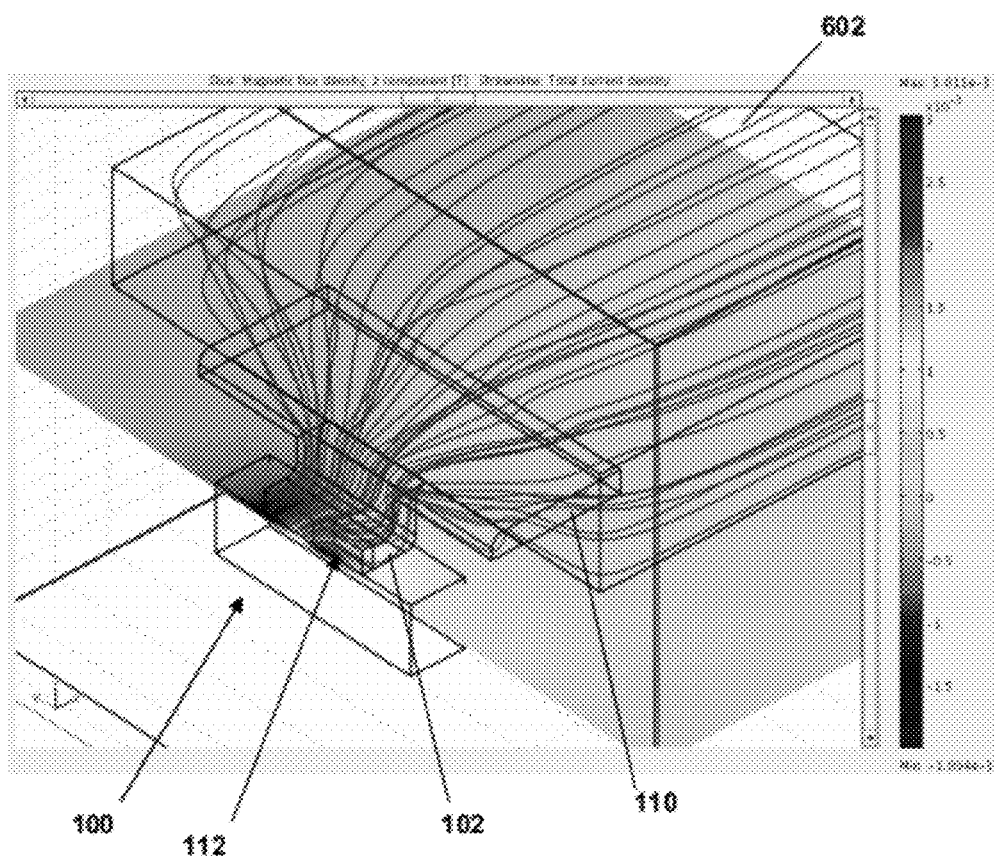
FIG. 8 depicts simulation results in a partial view of a current conductor clip according to an embodiment.

FIG. 8 depicts simulation results for another embodiment of clip 100, this time comprising a notch 112. Notch 112 is about 0.2 mm wide in this embodiment, such that the remaining cross-section for the current at the most narrow point of clip 100 is about 0.5 mm by about 0.2 mm, or about 0.1 mm². The current is 4.361 A, and the dissipated power in clip 100 is 3.56 mW. The resistance of clip 100 in this embodiment is about 187 µΩ, which corresponds to a full-scale current of up to about 53.5 A. The magnetic field 50 µm below footprint 102 of clip 100 and near notch 112 is 3 mT, whereas the magnetic field is only about −2 mT near the opposite edge of clip 100. If a first magnetic field sensor, such as a Hall plate, is arranged near the tip of notch 112 and second magnetic field sensor on the other side of the narrow portion of footprint 102, and if the total signal is calculated as the difference therebetween, the result is 5 mT/4.361 A. If each magnetic field sensor has a stochastic residual offset error of 50 µT, the offset error in the total signal is about 71 µT, and the ratio of signal over offset is about $16.2*A^{-1}$. Thus, the offset error of the sensor is about 0.062 A. The embodiment of FIG. 8 can also be used for a 25 A full-range because the full-scale magnetic field is about 20 mT. Comparing the embodiment of FIG. 8, in which clip 100 comprises notch 112, and the embodiment of FIG. 6, which omitted notch 112, the magnetic field in the embodiment of FIG. 8 is nearly double that of the embodiment of FIG. 6, whereas the increase in resistance is only 187/140, or about 134%.

Figure 9:
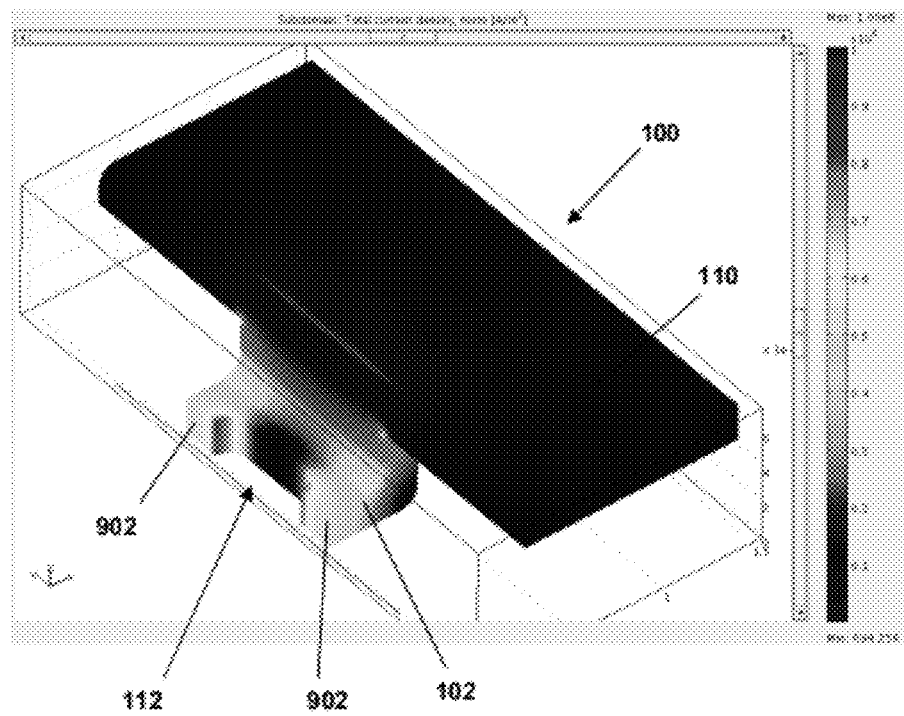
FIG. 9 depicts simulation results in a partial view of a current conductor clip according to an embodiment.
Figure 10:
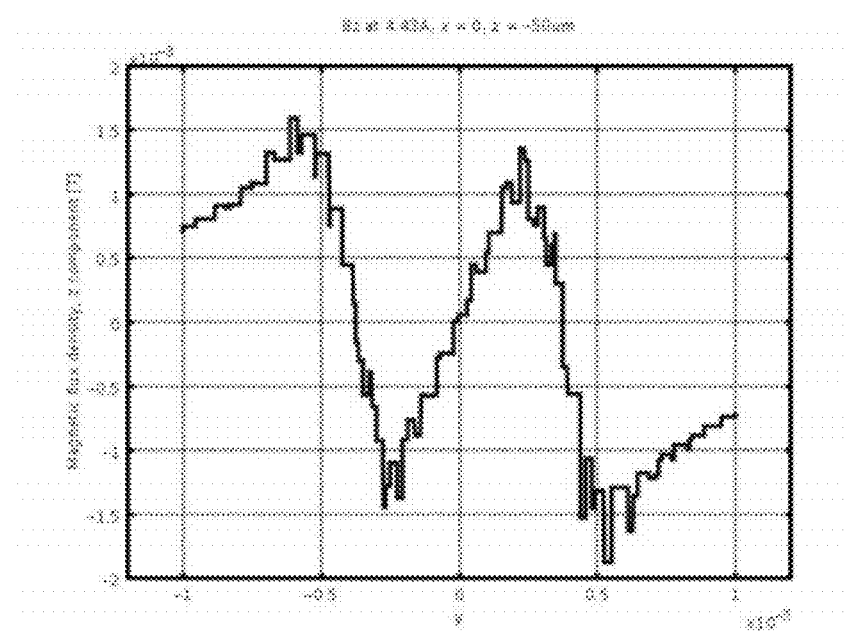
FIG. 10 depicts simulation results of flux density of the conductor clip of FIG. 9.

FIG. 9 depicts simulation results for another embodiment of clip 100 in which notch 112 in footprint portion 102 comprises an aperture. Such a configuration can be suitable for lower currents, when an even narrower constriction in footprint portion 102 can be beneficial, and offer advantages over an embodiment in which a very long, narrow notch is used, as such a notch can reduce the mechanical stability of clip 100. In the embodiment of FIG. 9, the two connecting portions 902 of footprint portion 102 have cross-sections of about 0.08 mm². The current in clip 100 is about 4.43 A, power dissipation about 3.6 mW, internal resistance about 185 µΩ, comparable to other embodiments discussed herein above. The magnetic field, however, is lower, with extremes being about 340 µT/A. Refer also to FIG. 10.

If four magnetic field sensors are used, such as in the embodiment of FIG. 5, and positioned at y=−0.6 mm, −0.2 mm, 0.2 mm and 0.6 mm, the total signal is about 10.2 mT. If each magnetic field sensor has a stochastic residual offset of 50 µT, the overall offset in the signal is about 224 µT, and the signal to offset ratio is $10.3*A^{-1}$. Thus, the offset error of the embodiment of FIG. 9 is about 0.1 A. In general, the embodiment of FIG. 9, with an aperture 902 in footprint portion 102, has about the same resistance, 61% more offset error, better crosstalk suppression and greater mechanical stability than an embodiment having a notch longer than at least half the width of footprint portion 102.

Figure 11:
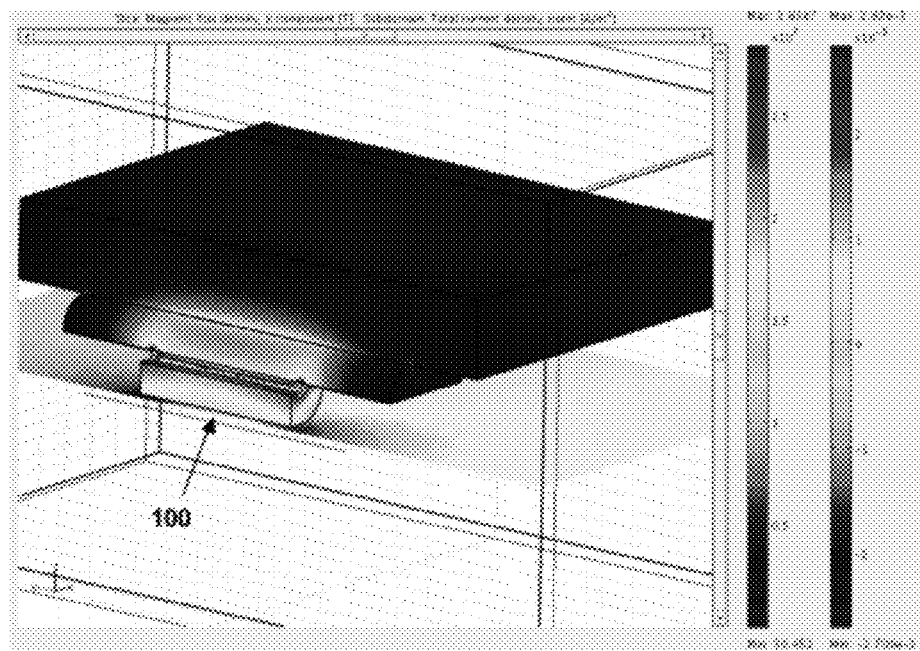
FIG. 11 depicts simulation results in a partial view of a current conductor clip according to an embodiment.
Figure 12:
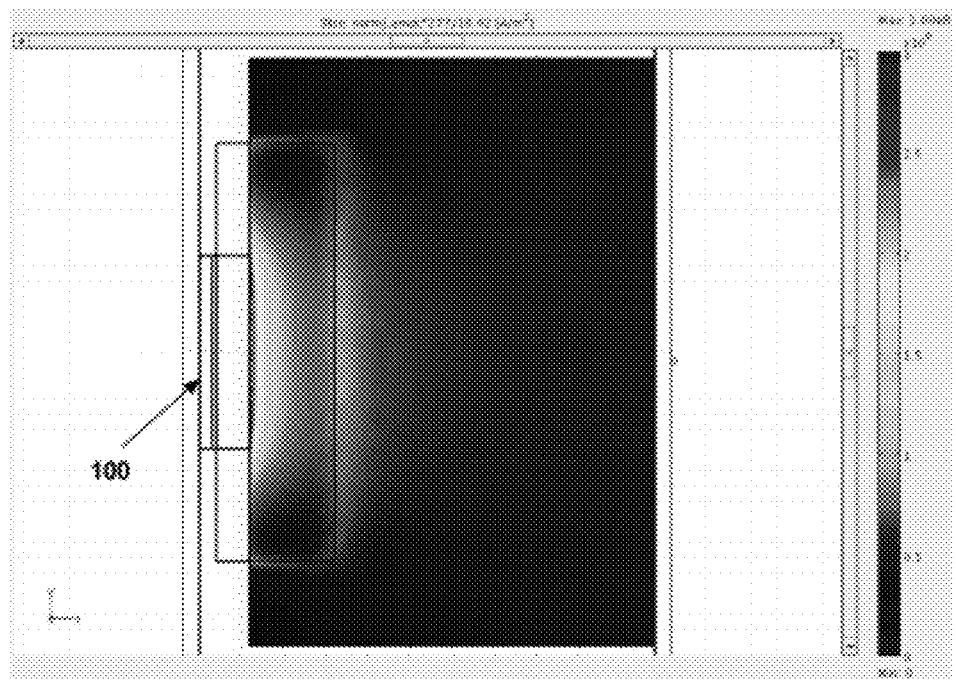
FIG. 12 depicts simulation results in a partial view of a current conductor clip according to an embodiment.

Another embodiment of clip 100 is depicted in FIGS. 11 and 12, in which clip 100 is thicker, as can be suitable for higher currents. Clip 100 is also wider, such as about 5 mm at contact areas 106 and 110 and about 2.3 mm at footprint portion 102. Clip 100 can be coupled to a die that is about 2 mm by about 3.5 mm, with a lateral separation distance of about 0.5 mm. In this embodiment, the current is about 16.42 A and the power dissipation is about 9.74 mW, with an internal resistance of about 36 $\mu\Omega$. Such an embodiment can be suitable for a current range of at least about 277 A. The magnetic field 50 $\mu$m below footprint portion 102 of clip 100 is about 2.5 mT at 16.42 A for 152 $\mu$T/A, or about 42 mT at 277 A. If two magnetic field sensors are used, positioned left and right of footprint portion 102 at a distance of about 2.5 mm, the resulting signal is about 304 $\mu$T/A. If the stochastic residual offset of each magnetic field sensor is 50 $\mu$T, the offset error of the sensor is about 71 $\mu$T, which is equivalent to about 0.23 A, or 0.084% of the full-scale current of 277 A. The current density in the solder joint between the bus bar and the contact portions of clip 100 is about 100 A/mm$^2$ to about 300 A/mm$^2$.

Figure 13A:
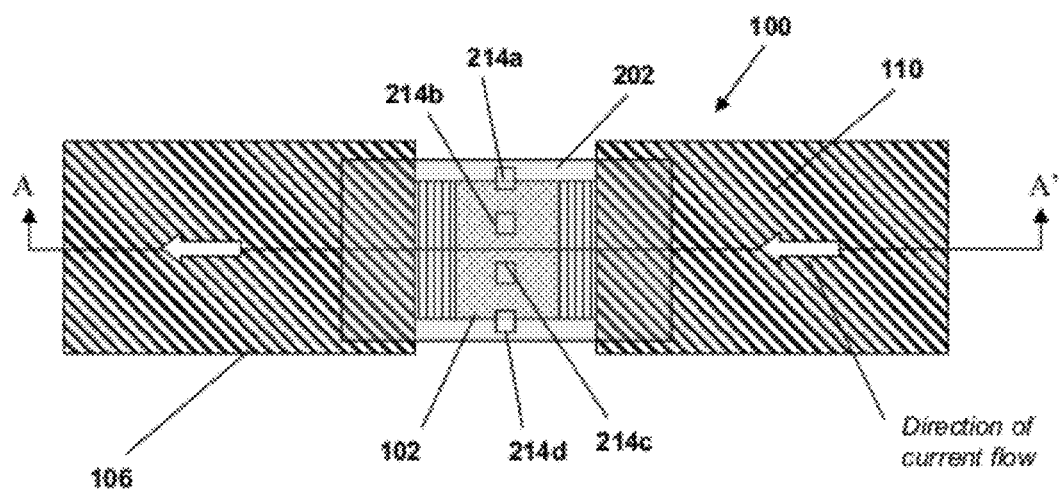
FIG. 13A depicts a top view of sensor components according to an embodiment.
Figure 13B:
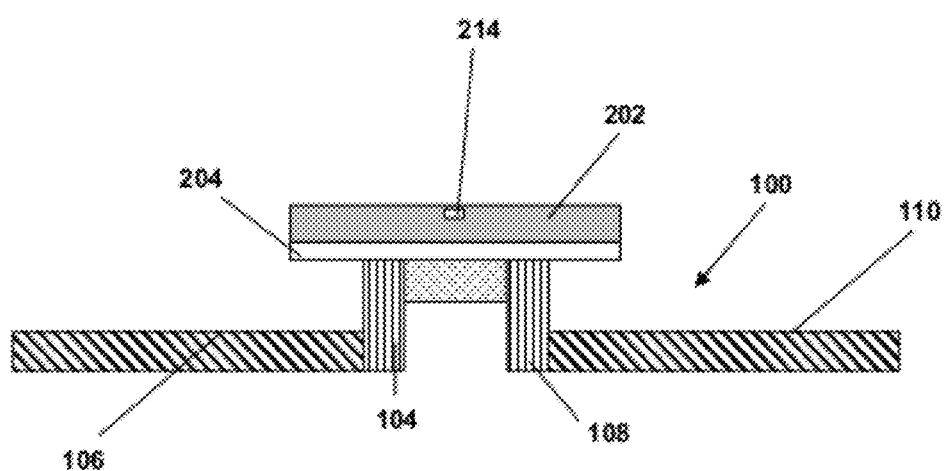
FIG. 13B depicts a side sectional view of the sensor components of FIG. 13A.

Because clip 100 is 400 $\mu$m thick in this embodiment, it is not necessary to keep the isolation layers less than 50 $\mu$m thick. Therefore, it is possible to attach clip 100 to the rear side of the die if the die is thin, such as about 60 $\mu$m in one embodiment. Refer, for example to FIG. 13, which depicts a thinner example embodiment of die 202.

In the embodiment of FIG. 13, isolation layer 204 is applied to the bottom side of die 202, and magnetic field sensors 214a, 214b, 214c and 214d are arranged at the top side of die 202, as depicted. This provides a new perspective for manufacturing the current sensor, as a single leadframe can be used, which comprises clip 100 and the leads (refer, for example to FIG. 2) of the sensor. This can simplify manufacturing by utilizing only one curing process to attach die 202 to clip 100. Further, footprint portion 102 can be larger because there is little or no risk of a short between clip 100 and the bond wires (refer, for example, to FIG. 2) because they are now on opposing sides of die 202. The placement of bond pads on die 202 should be chosen so that the bond pads are supported by footprint 102 of clip 100. If the bond pads would be near the perimeter of die 202, which as previously mentioned can extend over clip 100, the forces during the wire bonding process could damage or break die 202.

Figure 14A:
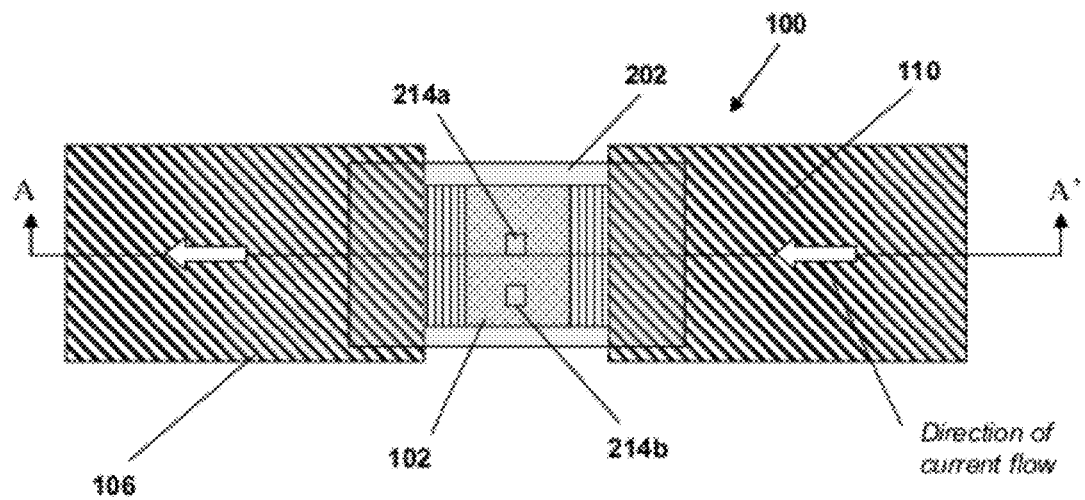
FIG. 14A depicts a top view of sensor components according to an embodiment.
Figure 14B:
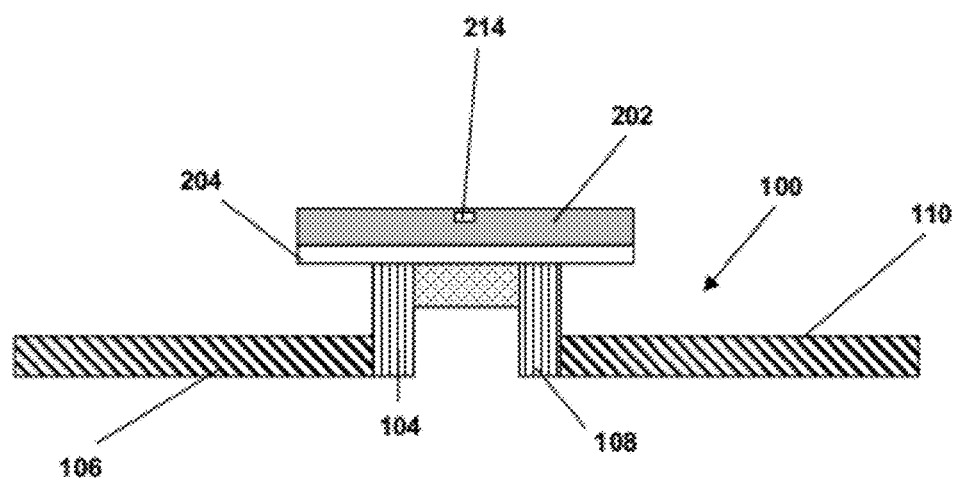
FIG. 14B depicts a side sectional view of the sensor components of FIG. 14A.

FIG. 14 depicts another embodiment of clip 100 and die 202, which comprises two magnetic field sensors 214a and 214b. It can be seen in FIG. 14A that magnetic field sensor 214a is positioned at the center of clip 100, and magnetic field sensor 214b is positioned nearer the edge of clip 100. This embodiment demonstrates that a high degree of symmetry is not necessary, and the magnetic field sensors need not be symmetric with respect to the center line of clip 100.

Advantages of arranging two magnetic field sensors closer together than the width of clip 100, as in FIG. 14, include better rejection of background magnetic fields; less effect on total signal of small tolerances in position due to inaccuracies during the die attach process; and potential availability of positions underneath clip 100 where the magnetic field strength depends less on frequency, which could be found via numerical simulation techniques. A disadvantage, however, is smaller magnetic fields from the current through clip 100. In general, however, if some sensitivity can be sacrificed, magnetic bandwidth of the system can be increased.

Figure 15:
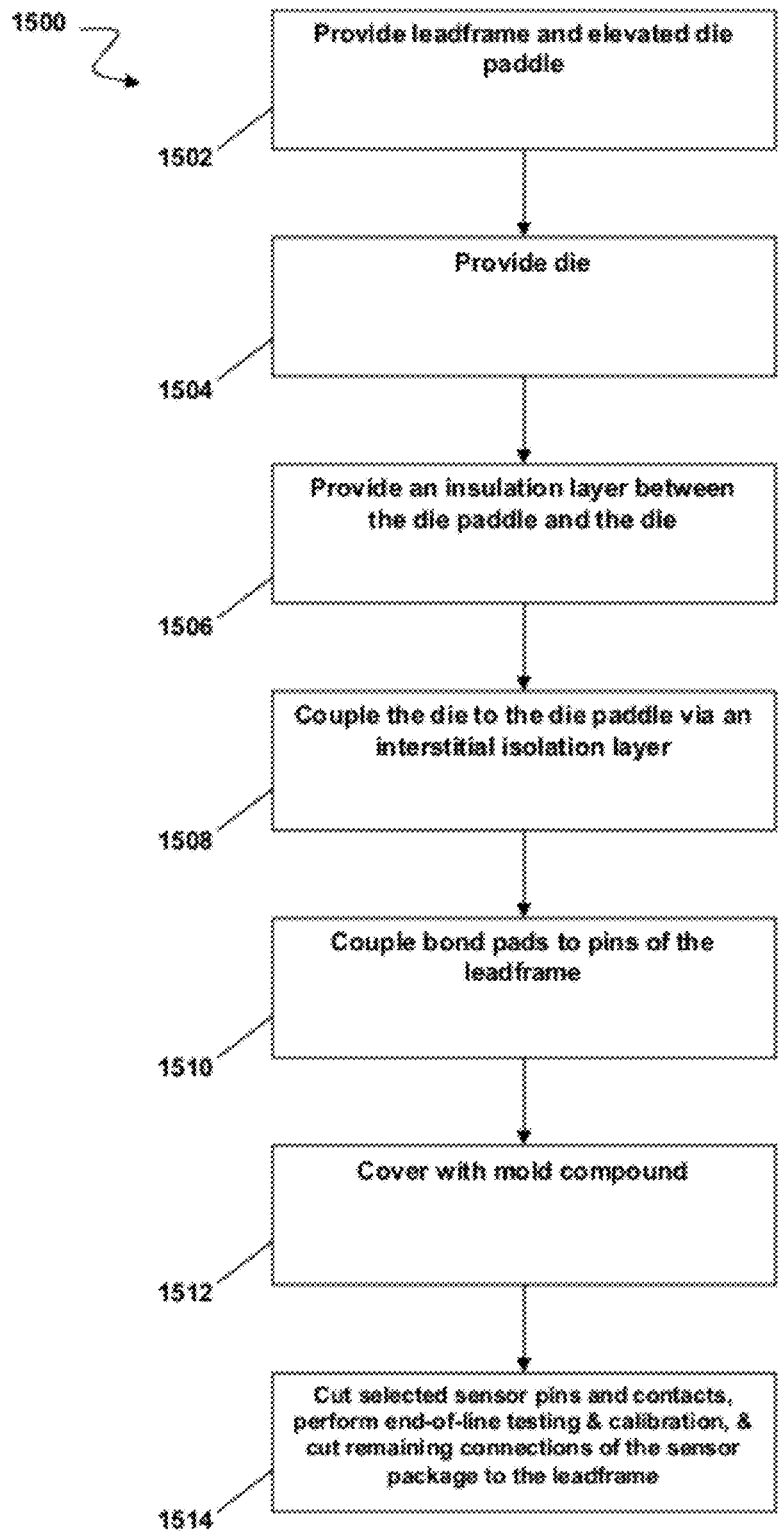
FIG. 15 is a flowchart of a manufacturing process according to an embodiment.

FIG. 15 is a flowchart of an exemplary manufacturing process 1500 for embodiments of a sensor package as discussed herein above. At 1502, a leadframe with sensor pins and an elevated die paddle are provided. In an embodiment, the die paddle has a smaller surface area than the die such that the sawing edge of the die extends beyond the die paddle along its perimeter by at least about several tenths of a millimeter.

At 1504, a die is provided. The die can have a thickness of about 60 $\mu$m in an embodiment, though this can vary in other embodiments.

At 1506, an insulation layer is provided between the die paddle and the bottom side of the die. In an embodiment, the insulation layer is applied to the die surface during a semiconductor manufacturing process on wafer level, before singulation of the dies. The insulation layer can also comprise a ceramic, porcelain, or glass platelet or a KAPTON foil in embodiments. The insulation layer is larger than the die paddle, or even larger than the die, in an embodiment to ensure voltage isolation between the die paddle and the sawing edge of the die.

At 1508, the die is coupled to the die paddle with an interstitial isolation layer. In embodiments, the coupling is by adhesive, soldering or some other suitable means. The top side of the die includes magnetic field sensors and bond pads and is spaced further from the die paddle than from the bottom side of the die.

At 1510, the bond pads are coupled to the pins of the leadframe. In an embodiment, the coupling is by bond wires.

At 1512, the die and a portion of the sensor pins are enclosed with mold compound, such as by transfer molding.

At 1514, the pins of the sensor excluding the ground pin are cut from the leadframe, and at least one of two contacts for the current clip is cut from the leadframe in an embodiment. End-of-line testing and calibration of the current sensor are performed, and remaining connections between the sensor package and the leadframe are cut.

Various customizations are also possible according to embodiments. For example, the contacts can be elongated if it is desired to vary the distance between the solder joints and the magnetic field sensors. It can be necessary to do this if the solder joints need to be plated with nickel, which is magnetic and can therefore affect the magnetic fields and thus the calibration of the current sensor. The magnetism of the nickel can be reduced, for example, by alloying with phosphorous, or the nickel-plated surfaces can be laterally shifted until they are sufficiently distal with respect to the magnetic field sensor element and to the regions of increased magnetic field.

Figure 16:
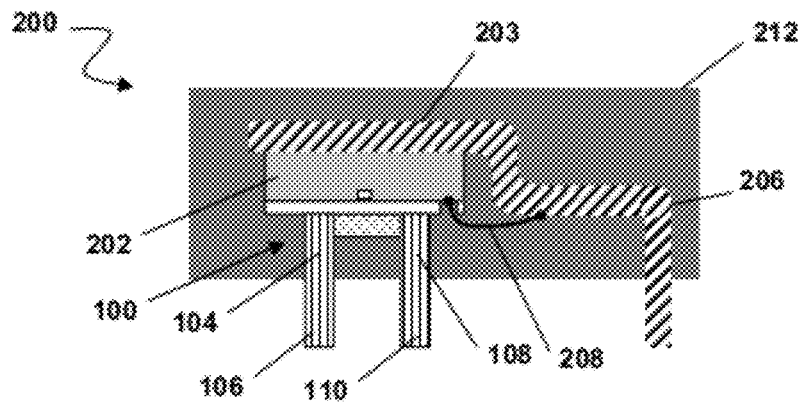
FIG. 16 is a side sectional view of a sensor package according to an embodiment.
Figure 17:
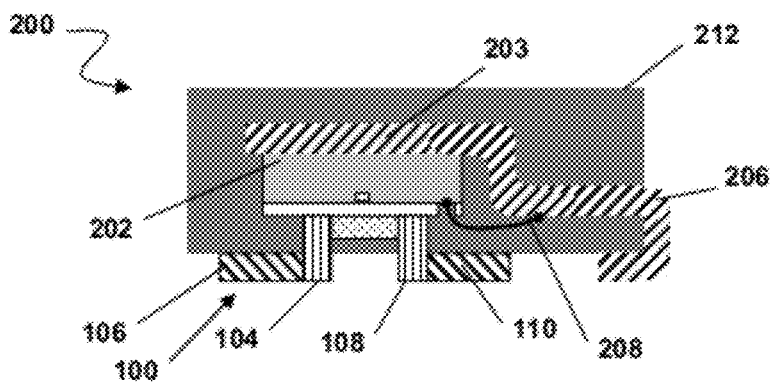
FIG. 17 is a side sectional view of a sensor package according to an embodiment.

There are also many possibilities for configuring the current contacts and sensor pins. In FIG. 16, sensor package 200 is configured for a through-hole application, and in FIG. 17 for a surface-mount application. In the embodiments of FIGS. 16 and 17, die paddle 203 is configured such that sensor pins 206 are at about the same height as die 202 so that bond wires 208 may be made essentially flat in order to have pillar portions 104 and 108 as short as possible. This can be particularly helpful in surface-mount applications in which the bond wires "dive" underneath the clip contacts. In the embodiment of FIG. 16, contacts 106 and 110 are not at right angles with pillar portions 104 and 108; rather, contacts 106 and 110 are extensions of pillar portions 104 and 108 extending through mold body 212.

Figure 18:
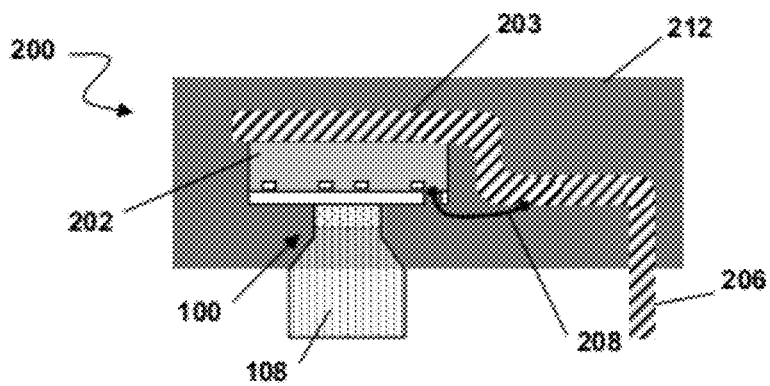
FIG. 18 is a side sectional view of a sensor package according to an embodiment.
Figure 19:
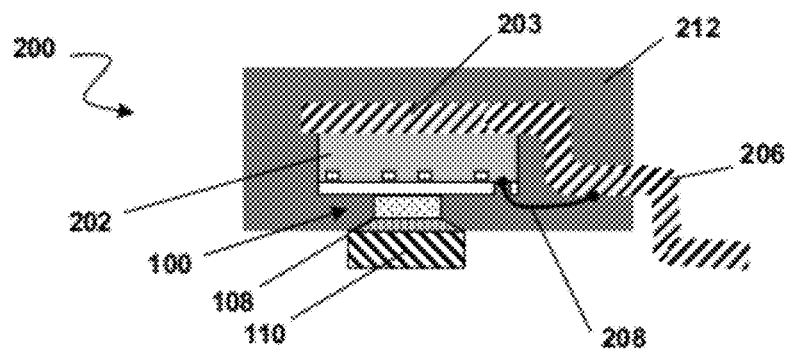
FIG. 19 is a side sectional view of a sensor package according to an embodiment.

In FIG. 18, clip 100 is rotated 90 degrees, as compared to the embodiment of FIG. 16, in order to provide a larger creepage distance and more significant clearance between sensor pins 206 and contacts 106, 110 of clip 100. FIG. 19 depicts a similar rotation of clip 100 with respect to the embodiment of FIG. 17.

Figure 20:
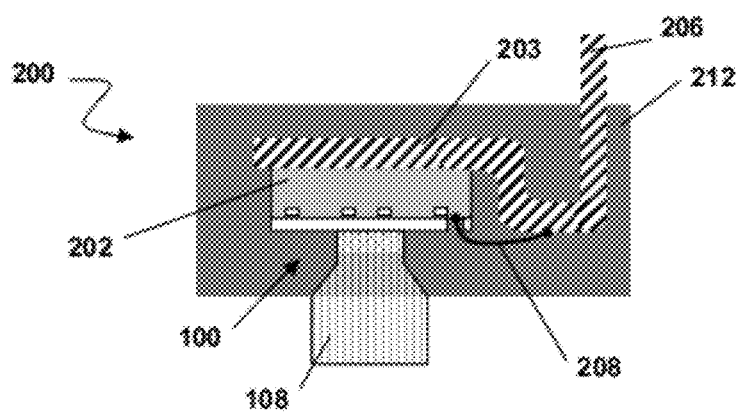
FIG. 20 is a side sectional view of a sensor package according to an embodiment.
Figure 21:
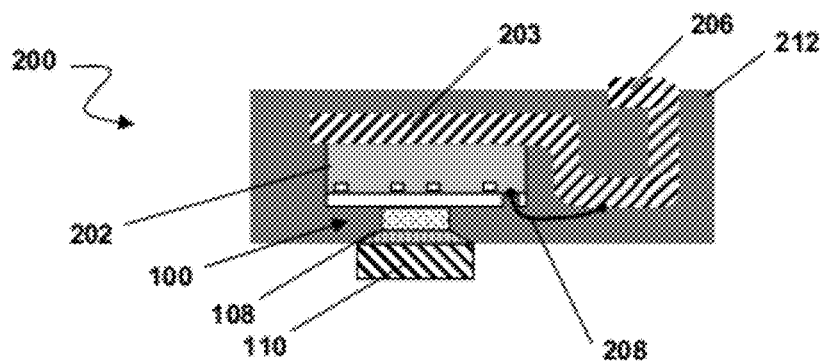
FIG. 21 is a side sectional view of a sensor package according to an embodiment.

Contacts 106 and 110 and sensor pins 206 can be accessible on the same surface of package 200 or on different surfaces, as depicted in FIGS. 20 and 21. Such a package 200 can be mounted, for example, in a hole of a printed circuit board (PCB), with sensor pins 206 accessible from the top side of the PCB and clip contacts 106, 110 from the bottom side of the PCB. The PCB can be used to increase the creepage and clearance distances between sensor pins 206 and clip contacts 106, 110. On the bottom side of the PCB, the high current rail and power devices of the system can be mounted, whereas the control and low voltage components are mounted on the top side of the PCB, in embodiments.

Figure 22:
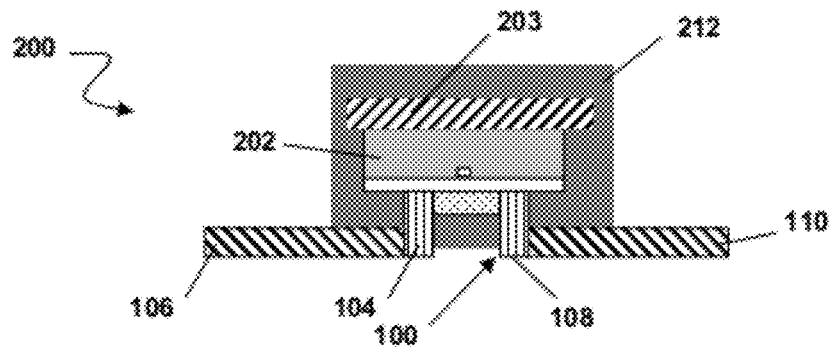
FIG. 22 is a side sectional view of a sensor package according to an embodiment.
Figure 23:
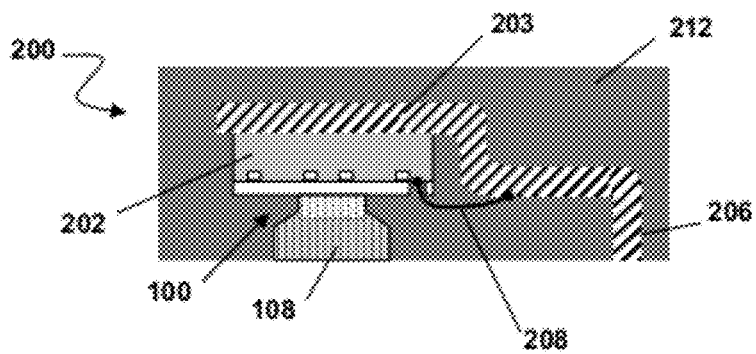
FIG. 23 is a side sectional view of a sensor package according to an embodiment.

In other embodiments, current contacts 106, 110 can project from mold body 212, as depicted in FIG. 22, or can be flush with it, as depicted in FIG. 23, as a so-called "leadless" package. In the embodiment of FIG. 22, the projecting contacts 106, 110 can be fixed to current rails bolting or ultrasonically welded to a bus bar or otherwise suitably coupled.

In embodiments, pillar portions 104 and 108 need not be configured at ninety degrees with respect to the surface of die 202. Angles closer to 90 degrees, however, can be more easily manufactured, such as by pressing sheet metal. Another advantage of pillar portions 104, 108 being perpendicular to the surface of die 202 is that pillar portions 104, 108 are then shorter, which can minimize electrical and thermal resistance between footprint portion 102 and contact portions 106 and 110. Yet another advantage is smaller lateral size of the spacing between contact portions 106 and 110, which can save space, increase the number of devices per strip during production and consequently reduce the cost of manufacturing.

Figure 24:
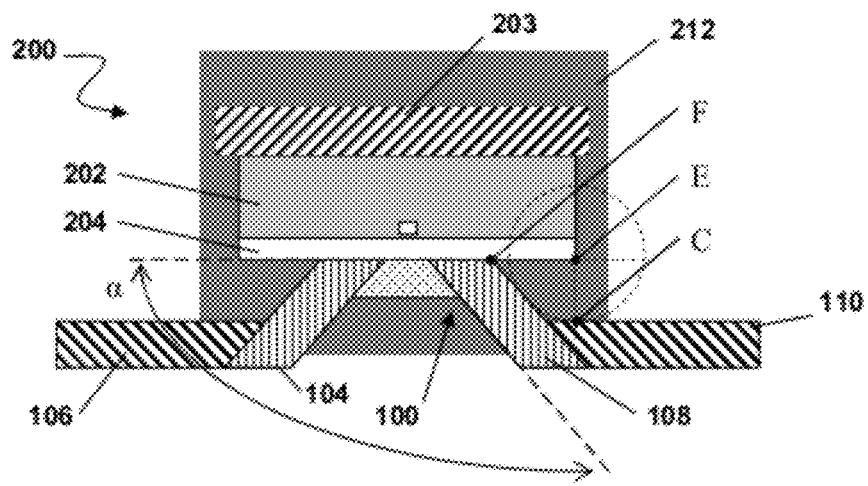
FIG. 24 is a side sectional view of a sensor package according to an embodiment.

FIG. 24 depicts an embodiment in which pillar portions 104 and 108 are not perpendicular with respect to the surface of die 202 but are at angles close to 90 degrees. For example, α can be within a range of about 50 degrees to about 130 degrees in various embodiments. In general, a should be selected such that the dielectric strength between clip 100 and die 202 is maximized, with two paths of dielectric breakdown to be considered: through the bulk of mold body 212 and along an interface of mold body 212 to isolation layer 204. The latter is often the weaker; therefore, it should typically be longer. In FIG. 24, the bulk breakthrough is illustrated as the distance between E and C, whereas the breakthrough along the interface is illustrated as the distance between E and F.

Figure 25:
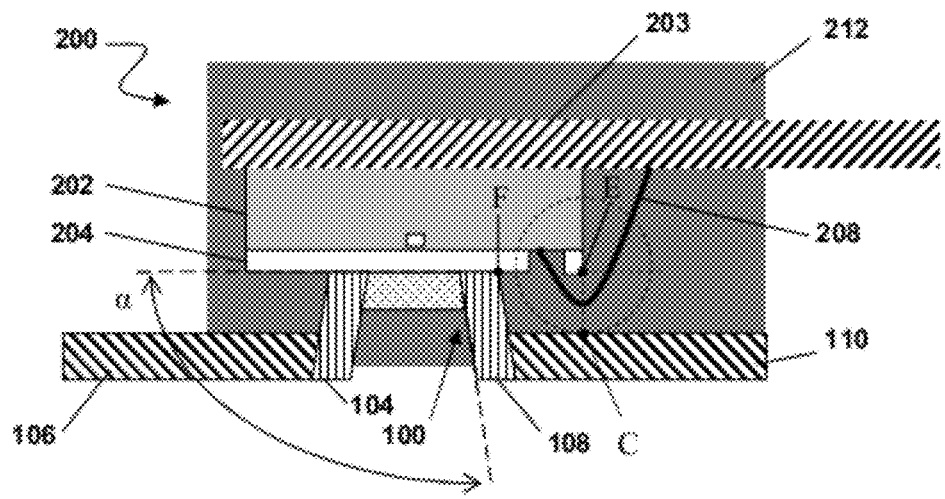
FIG. 25 is a side sectional view of a sensor package according to an embodiment.

Referring to FIG. 25, if there are bond pads on the surface of die 202, which are not typically covered by insulating layers, and if there are bond wires 208 which are also not coated by an insulating film, then the distance E-F between footprint portion 102 and the edge of die 202 is not the worst case for dielectric breakdown, rather the distance between F, and the nearest bond wire 208 along the interface between mold body 212 and isolation layer 204 and the distance between C and the nearest bond wire 208 through mold body 212.

To increase the voltage isolation between clip 100 and bond wires 208 and bond pads, a spray coating isolation, such as benzocyclobutane (BCB), maybe applied after bond wires 208 are installed between the bond pads and leads. Additionally or alternatively, the surfaces of clip 100 that face bond wire 208 and the bond pads can be coated with a dielectric isolation film.

Figure 26:
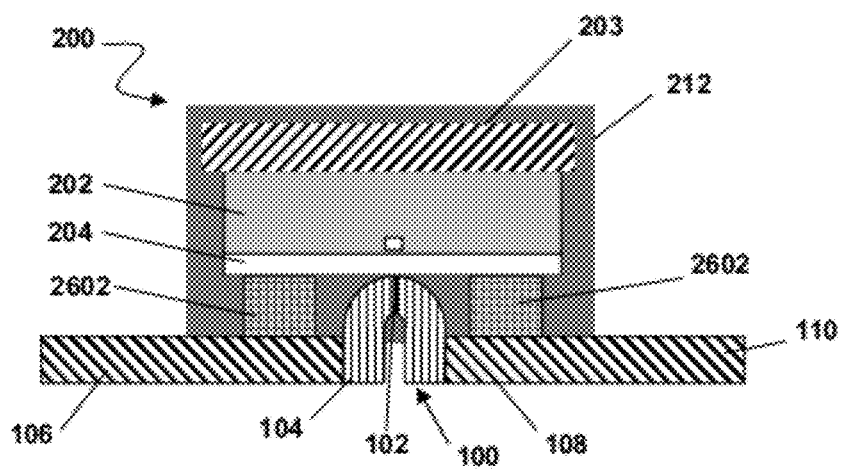
FIG. 26 is a side sectional view of a sensor package according to an embodiment.

In FIG. 26, clip 100 comprises a footprint portion 102 that comprises, at the point of contact with die 202, a slim volume, which reduces the length of the current path to a minimum. In a strictly mathematical sense, the contact between footprint portion 102 and isolation layer 204 is no longer an area in the embodiment of FIG. 26 but rather a line of contact that extends over a certain length, the width of clip 100, into the drawing plane of FIG. 26. Nevertheless, footprint portion 102 of clip 100 can still be considered to be parallel to the surface of die 202, because the contact line is parallel to the surface in a mathematical sense. Embodiments optionally can comprise a support structure(s), such as support studs 2602, to support die 202 given the narrow configuration of footprint portion 102. The support structure or studs 2602 can be conductive or insulating in various embodiments.

Figure 27:
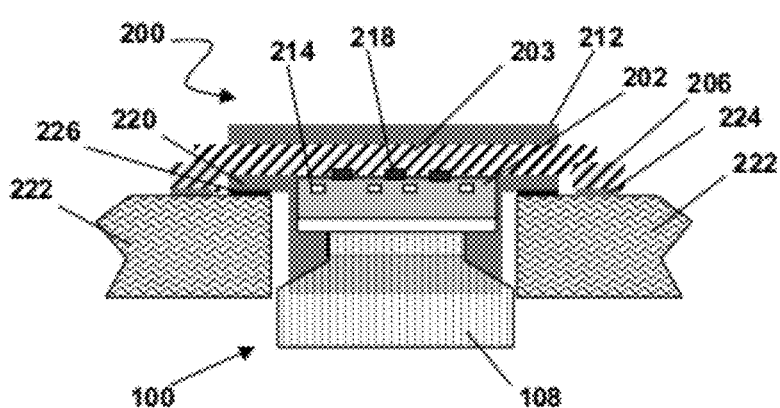
FIG. 27 is a side sectional view of a sensor package mounted to a PCB according to an embodiment.

Referring to FIG. 27, if clip 100 is coupled to the back side of die 202, die 202 can be contacted in a flip-chip configuration with solder bumps 218 on leadframe 203. In embodiments, die 202 should be thin because magnetic sensor elements 214 are on the top of die 202 and clip 100 is below die 202. Package 200 can comprise a shoulder 220 around its circumference to help improve the voltage isolation between the top and bottom, such as for when inserted in a PCB 222. In FIG. 27, a sealing rim 226 between package 200 and PCB 22 is also included, which can reduce creepage between clip 100 and sensor pins. Sealing pastes or grease and adhesives can also be applied to the rim of PCB 222, for example. Solder contacts 224 couple pins 206 to traces of PCB 222.

Figure 28:
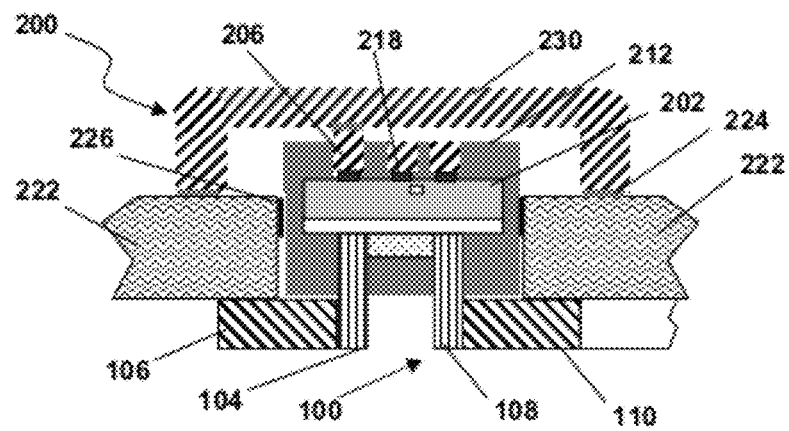
FIG. 28 is a side sectional view of a sensor package mounted to a PCB according to an embodiment.

In another embodiment, shoulder 220 is omitted such that mold body 212 fits within the hole in the PCB 222, as in FIG. 28. In the embodiment of FIG. 28, sensor package 200 comprises a bracket 230 to couple pins 206 to PCB 222. In an embodiment, bracket 230 is coupled to a top surface of PCB 222 at solder contacts 224. Given that the sealing is along a rim 226 on the perimeter of package 200, a tighter tolerance is needed between mold body 212 and the hole in PCB 222 in embodiments such as FIG. 28 when compared with the embodiment of FIG. 27 comprising shoulder 220.

Figure 29:
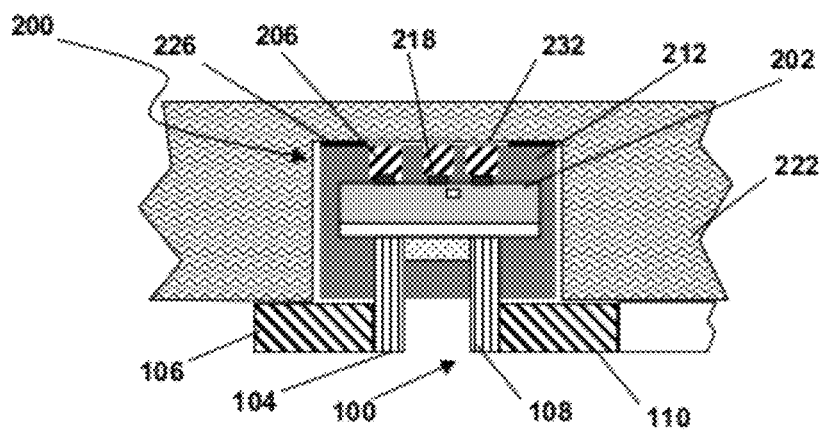
FIG. 29 is a side sectional view of a sensor package mounted to a PCB according to an embodiment.

Another embodiment is depicted in FIG. 29 in which PCB 222 is configured such that no shoulder is needed on mold body 212, as in FIG. 27, and package 200 is positioned within a recess of PCB 222. Sealing rim 226 is positioned at the top surface of package 200, with sensor pins 206 are positioned inside. Solder joints 232 couple pins 206 to PCB 222.

In general, therefore, embodiments of current sensors benefit from good isolation between current contacts and contact pins. Even if good isolation is achieved by the mold compound and isolating layer with high dielectric strength, clearance distance between the contacts and pins as well as creepage can still present challenges. Standardization rules generally call for certain dimensions, which in applications at more than about 5 kV can result in large packages. In embodiments, however, if the sensor package can offer two planes, one for the current contacts and another for the pins of the low-voltage leads, with some form of sealing therebetween, the sensor package can be very small with creepage and clearance requirements met after the package is installed in the module, such as a PCB in embodiments. In embodiments, the package can also comprise some means, such as tape or a clip, for mechanically coupling the package to the PCB during the assembly process.

Figure 30A:
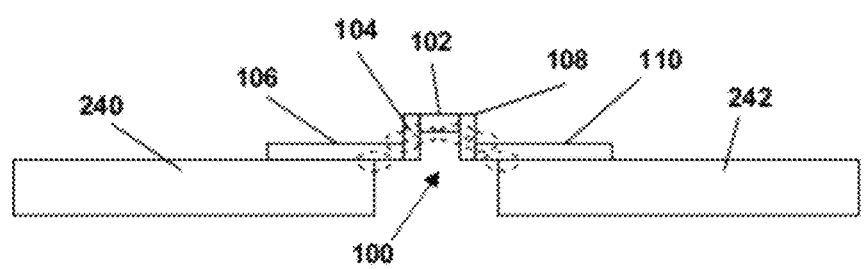
FIG. 30A depicts a side sectional view of sensor components mounted to bus bars according to an embodiment.
Figure 30B:
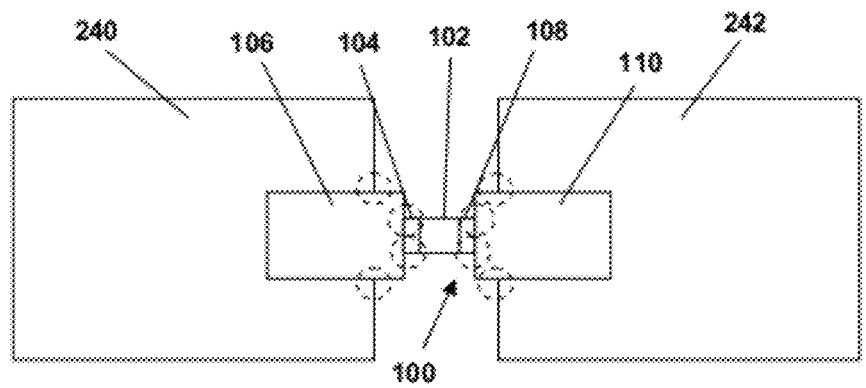
FIG. 30B depicts a top view of the sensor components of FIG. 13A.

Referring to FIG. 30, another embodiment of clip 100 is depicted. Resistance of clip 100 can be reduced if current streamlines do not need to bend around sharp corners, but an external bus bar 240 (incoming) and 242 (outgoing) is typically much wider than clip 100, resulting in inevitable current flowline bending. Areas of potential discontinuities are circled in FIG. 30, of which FIG. 30A is a side perspective view and FIG. 30B is a top view.

Figure 31A:
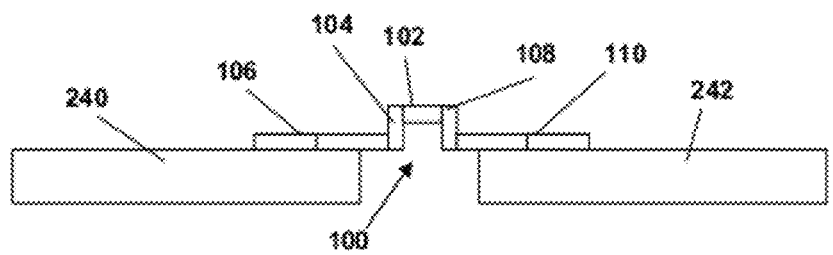
FIG. 31A depicts a side sectional view of sensor components according to an embodiment.
Figure 31B:
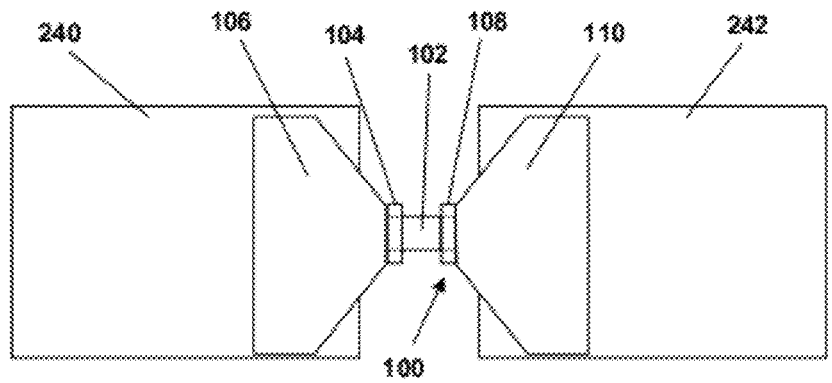
FIG. 31B depicts a top view of the sensor components of FIG. 31A.
Figure 32:
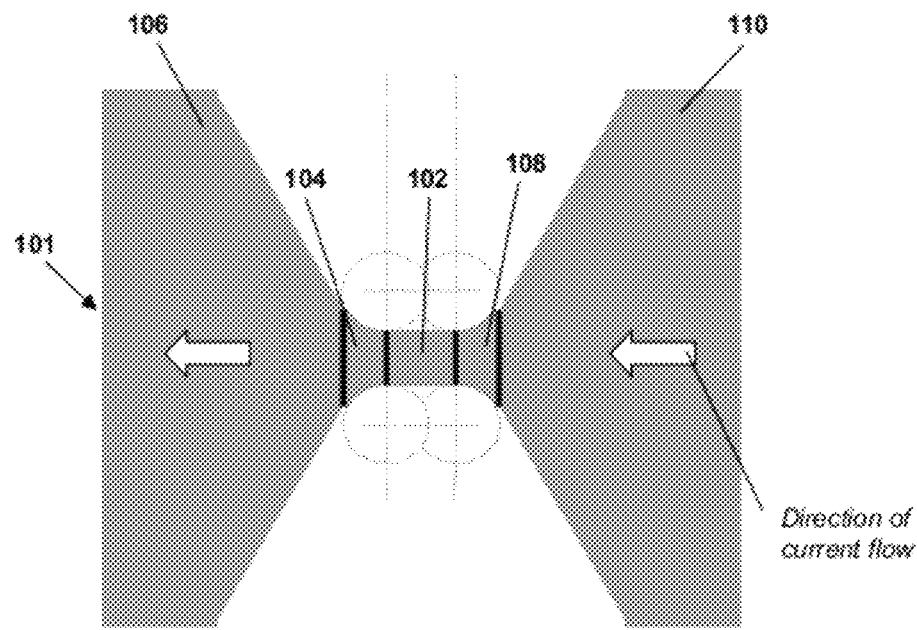
FIG. 32 is a top view of clip sheet metal according to an embodiment.
Figure 33:
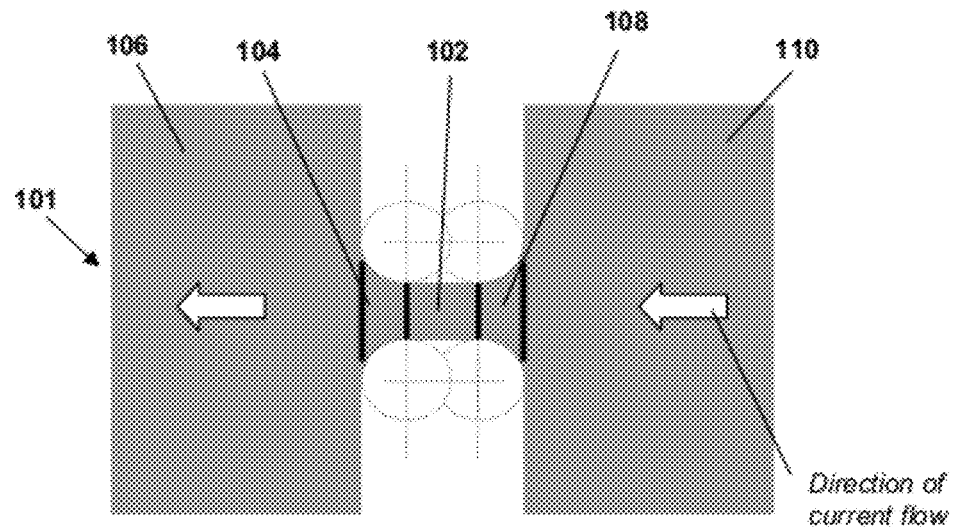
FIG. 33 is a top view of clip sheet metal according to an embodiment.
Figure 34:
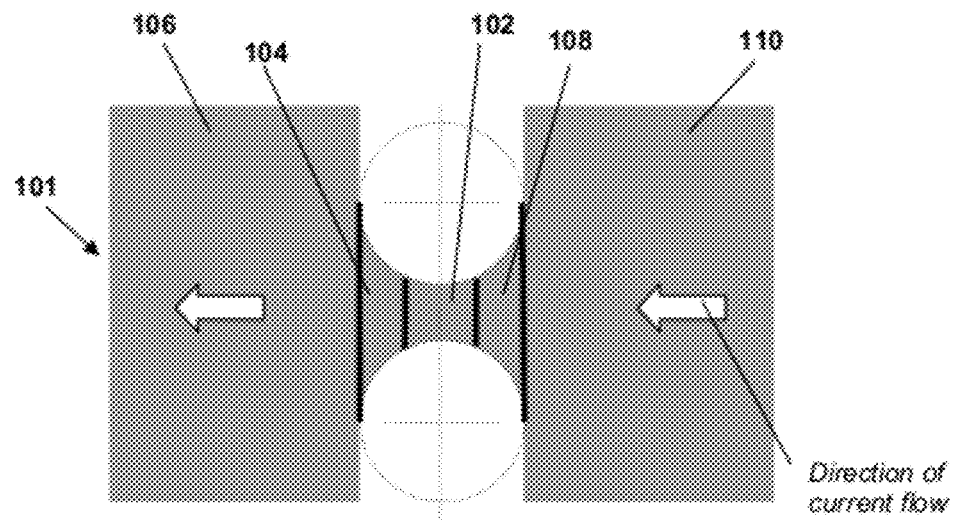
FIG. 34 is a top view of clip sheet metal according to an embodiment.

An option for reducing or eliminating the discontinuities is to reduce the width of bus bar 240, 242 and clip 100 at a constant angle, one embodiment of which is depicted in FIG. 31. FIG. 32 depicts the sheet metal 101 of clip 100 before it has been formed into clip 100. The vertical black lines denote edges along which sheet metal 101 is bent to form clip 100. The thin dashed lines denote virtual circles that define the edge of sheet metal 101 in order to avoid sharp bends in the current lines. In the embodiment of FIG. 32, footprint portion 102 omits notch 112. FIGS. 33 and 34 depict alternate shapes of sheet metal 101, with the embodiment of FIG. 34 providing the smallest resistance. In general, the radius of the circles should be larger than the height of clip 100, with the height being the vertical distance between contact area 106 or 110 and the top surface of the die. The circle can also degenerate to an ellipse.

In operation, it is important that clip 100 remains securely coupled to die 202. To accomplish secure coupling, embodiments can use adhesive, soldering or some other suitable technique. Regarding soldering, diffusion soldering between footprint portion 102 and a metal layer on top of the surface of die 202 can be used. This metal layer can be isolated from the rest of die 202 by a dielectric isolation layer, comprising polyimide, silicon dioxide or silicon nitride, in embodiments, and, in general, serves merely a mechanical purpose related to adhesion with no electrical function.

In embodiments, however, this on-chip metal layer can be used for alignment of clip 100 with respect to die 202. The on-chip metal layer is typically aligned very accurately with respect to die 202 because of the high accuracy of the semiconductor manufacturing processes. If clip 100 is soldered to this layer, the solder can pull a slightly eccentrically mounted clip 100 into the center of the on-chip metal layer through the action of its surface tension.

Figure 35:
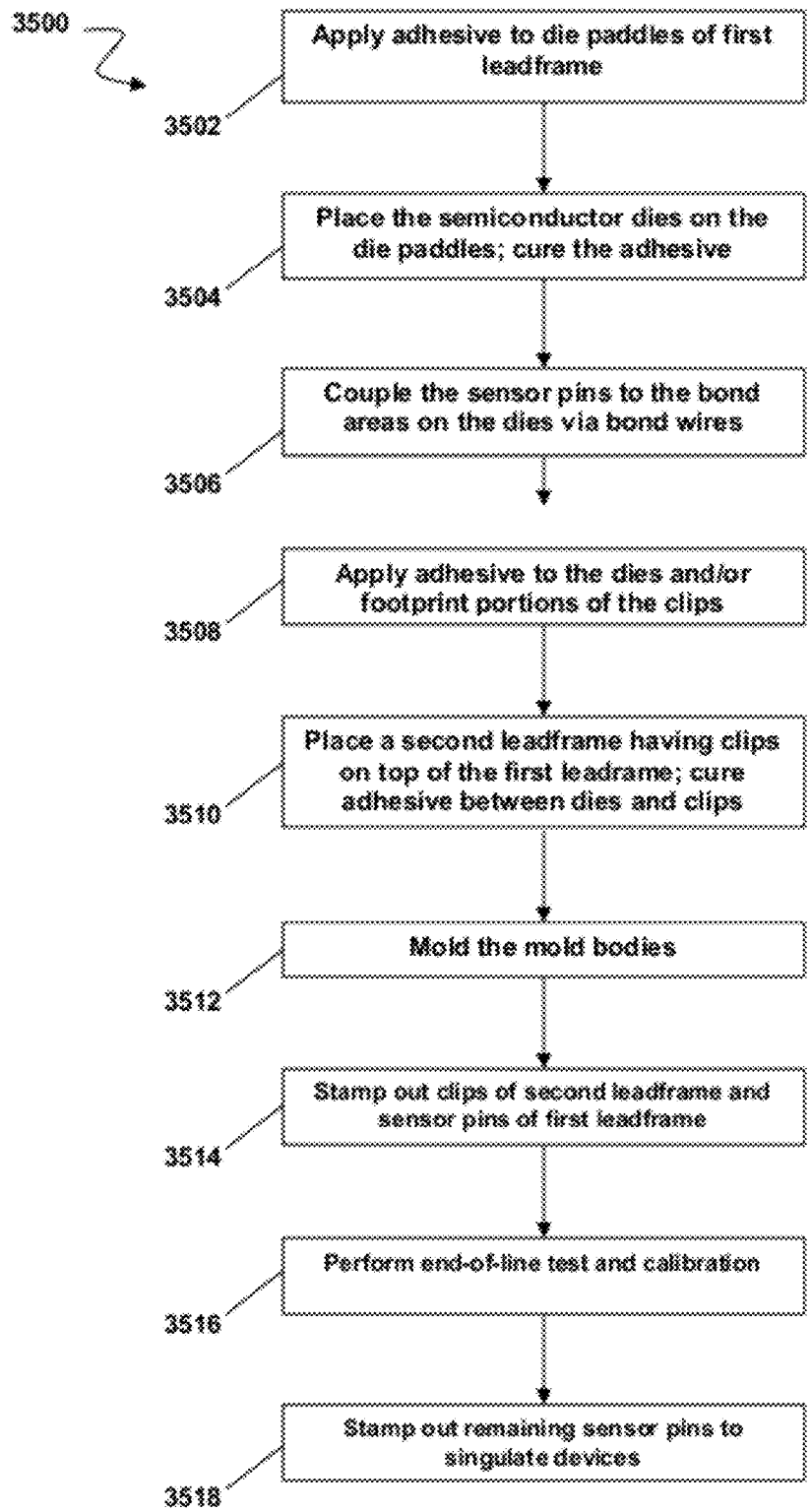
FIG. 35 is a flowchart of a manufacturing process according to an embodiment.

Because the area of footprint portion 102 is small, challenges can be presented during assembly. For example, the adhesive force of solder paste or adhesive applied to the bottom of clip 100 and/or the top of die 202 can be too small to hold clip 100 in place before the solder or adhesive has developed full strength, such as after curing. Therefore, it can be advantageous in embodiments to not attach individual clips 100 to individual dies 202 but rather to have several clips 100 arranged in a second leadframe. Dies 202 are attached to a first leadframe according to conventional semiconductor manufacturing techniques, and the second leadframe is then placed on top of the first leadframe. FIG. 35 is a flowchart of an embodiment of a manufacturing process 3500 according to such an embodiment.

At 3502, adhesive is applied to the die paddles of the first leadframe.

At 3504, the semiconductor dies are placed on the die paddles. The adhesive is cured.

At 3506, the sensor pins are coupled to the bond areas on the dies by bond wires.

At 3508, adhesive is applied to the dies and/or footprint portions of the clips.

At 3510, a second leadframe having the clips is placed on the first leadframe having the dies. In an embodiment, this is carried out such that the footprint portions of the clips are placed at or near the magnetic field sensor elements on the top surfaces of the dies. In another embodiment, the first and second leadframes can also be connected via secondary means, for example along their circumferential frames. This can be helpful or necessary if the cumulative area of the footprints of all of the devices per strip is too small to take up the mechanical load during the handling process. These additional means can comprise mechanical fixtures such as rivets or nuts; chemical joints such as gluing or soldering; or physical joints such as spot welding, among others. The adhesive between the dies and clips is cured.

At 3512, the mold bodies are molded.

At 3514, the clips of the second leadframe are stamped out, either completely or only on the current input or output side. The sensor pins except for the ground pins of the first leadframe are also stamped out. If an isolation test in which a voltage of several kVs is applied between the current rail and the sensor pins is desired or required, all low voltage pins of the sensor can be stamped out such that no connection to the primary conductor exists. Step 3514 can be omitted or carried out only partly if the devices are large, with full stamping carried out at 3518.

At 3516, end-of-line testing and calibration of the sensor devices are carried out.

At 3518, the remaining sensor pins are stamped out to singulate the sensor devices.

If the contact portions of the clips are large when compared to the size of the footprint portion, in particular if the footprint portions are mechanically fragile because they include one or more notches to shape the current path, it can be helpful or necessary to add non-conducting support structures to the clips. This can be, for example, an adhesive foil attached to the contacts portions, or those parts of the footprint portions not in contact with the isolation layer after clip coupling can be molded in a plastic encapsulation in embodiments.

Figure 36A:
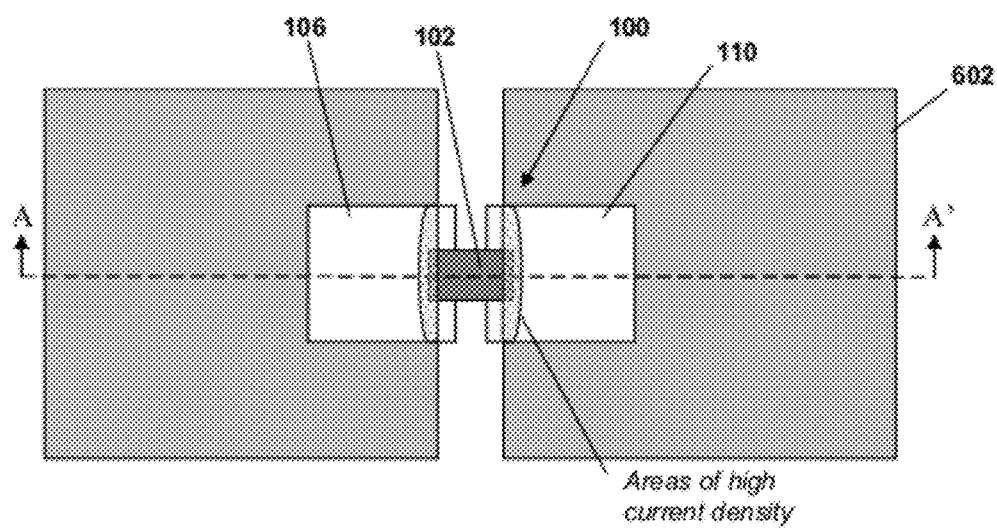
FIG. 36A depicts a top view of sensor components according to an embodiment.
Figure 36B:
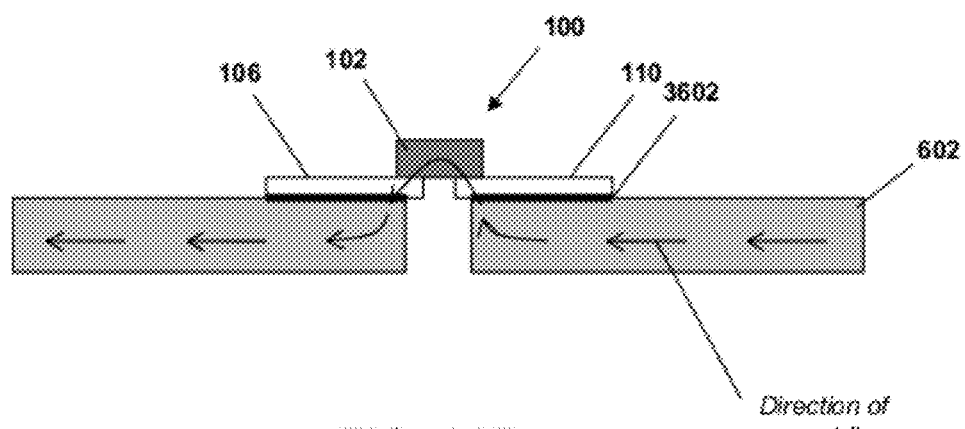
FIG. 36B depicts a side sectional view of the sensor components of FIG. 36A.

In other embodiments, the clip comprises multiple layers, such as a contact layer and a footprint layer. Each layer can be stamped out separately from sheet metal and coupled by soldering or welding, such as UV welding, in embodiments. In another embodiment, the contact layer is stamped from sheet metal while the footprint portion is galvanically grown on top of the contact layer, such as via electrolytic deposition. This avoids other materials, such as solder, and can establish a full surface contact between the layers, avoiding spot welding. Advantages include a smaller separation distance, even less than the layer thickness, between the contacts, and the possibility of having different thicknesses of the two layers. Layer thickness is important for voltage isolation, because the thickness of the footprint portion is identical to the vertical distance between the bottom surface of the contacts and the die surface. Also, the current density is related to the ratio of the thicknesses of the contacts and the bus bar. If the bus bar is thick and the contacts are thin, the current is inclined to flow vertically through the central parts of the contacts, leading to strong peaks in the current density distribution near the center of the solder area, as depicted in FIG. 36. Areas of high current density in solder layer 3602 between bus bar 602 and the contact layer of contact portions 106 and 110 are also illustrated.

Figure 37A:
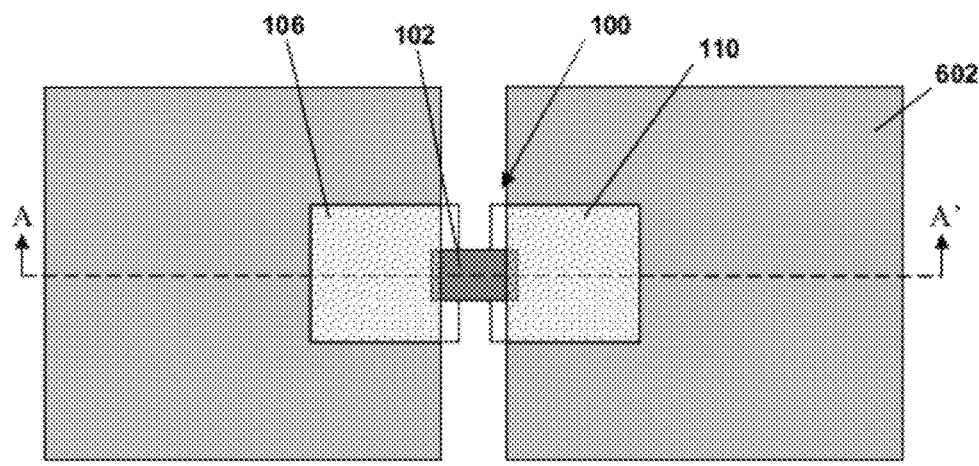
FIG. 37A depicts a top view of sensor components according to an embodiment.
Figure 37B:
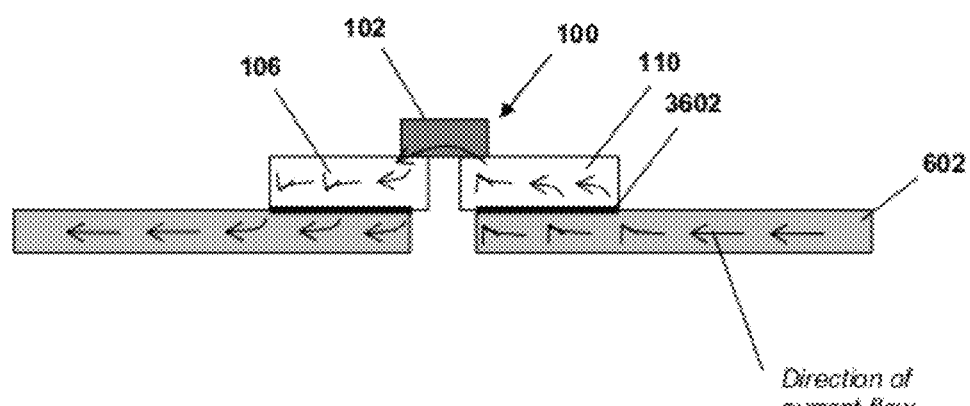
FIG. 37B depicts a side sectional view of the sensor components of FIG. 37A.

If bus bar 602 is thinner than the contact layer, the current is included to flow laterally through the contact layer, which reduces the excessive current densities in solder layer 3602 between bus bar 602 and the contact layer because the current is spread more evenly over solder layer 3602. As depicted in FIG. 37, the current density is nearly homogeneous in solder layer 602.

In embodiments, contact portions 106 and 100 can overlap bond pads on die 202, or not. The length, height and other characteristics of the bond loops can be adjusted in these various embodiments for sufficient vertical distance and isolation. The thickness of the contact layer can be less than or greater than the thickness of the footprint layer in order to pull the peak current density in solder layer 602 out of the vertical center plane, in an embodiment.

Figure 38A:
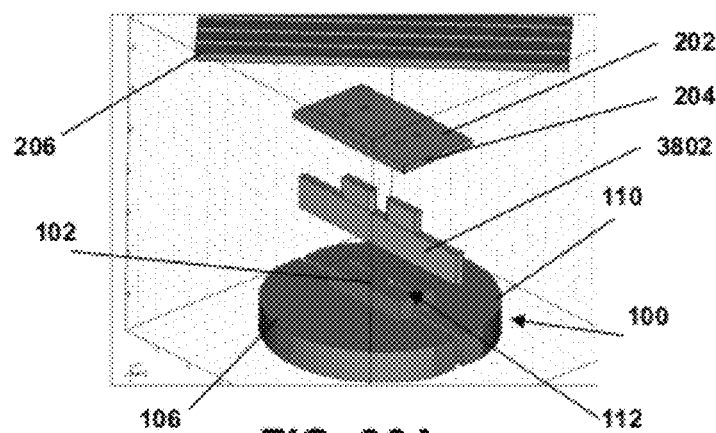
FIG. 38A is an exploded view of current sensor components according to an embodiment.
Figure 38B:
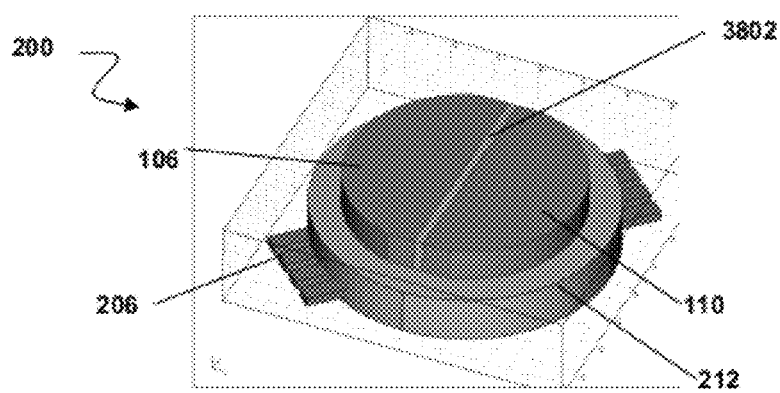
FIG. 38B is a top view of the current sensor components of FIG. 38A.
Figure 38C:
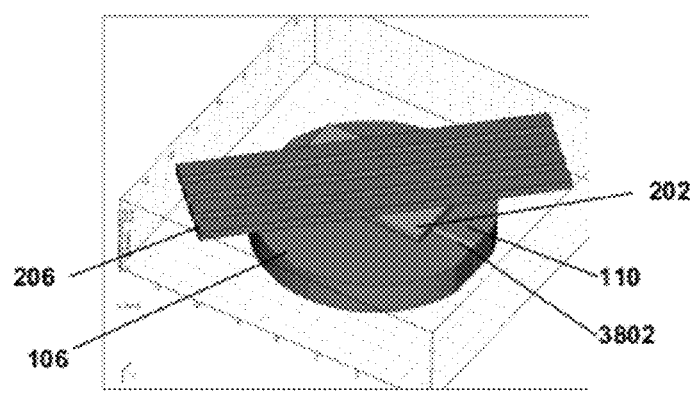
FIG. 38C is a bottom view of the current sensor components of FIGS. 38A and 38B.

Another embodiment is depicted in FIG. 38, in which package 200 is configured for insertion into a hole in a PCB, with a bus bar on a first (high voltage, high current) side of the PCB and sensor pins 206 on the second (low voltage, low current) side of the PCB, with a sealing ring between. FIG. 38A is an exploded view of clip 100, a reinforcement mold 3802, isolation layer 204, die 202, contact pads and sensor leads 206. In embodiments, reinforcement mold 3802 comprises a suitable insulating material, such as a mold compound material in an embodiment.

Clip 100 can be formed from a contact layer, with each contact portion 106 and 110 separately stamped. Contact portions 106, 110 can then be mounted in a mold cavity, where reinforcement mold 3802 is cast to fill the gap between the portions 106 and 110. The footprint layer, comprising footprint portion 102, can then be electrolytically grown on top. Die 202 can then be mounted, with isolation layer 204 in between. In an embodiment, this manufacturing is carried out with the contact layer fixed in a frame. The frame can then be placed into another mold tool to cover die 202 with mold body 212, which is shown in FIG. 38B.

In embodiments, such a device can be suitable for currents in a range of about 5 A to about 500 A or more, such as about 1000 A, depending upon the configuration of notch 212 in footprint portion 102, the thicknesses and configurations of the contact and footprint layers and the size of the contact surfaces. Voltage isolation can be up to about 10 kV in embodiments, with the creepage distance designed by the overlapping parts of the PCB into which package 200 is inserted.

Figure 39:
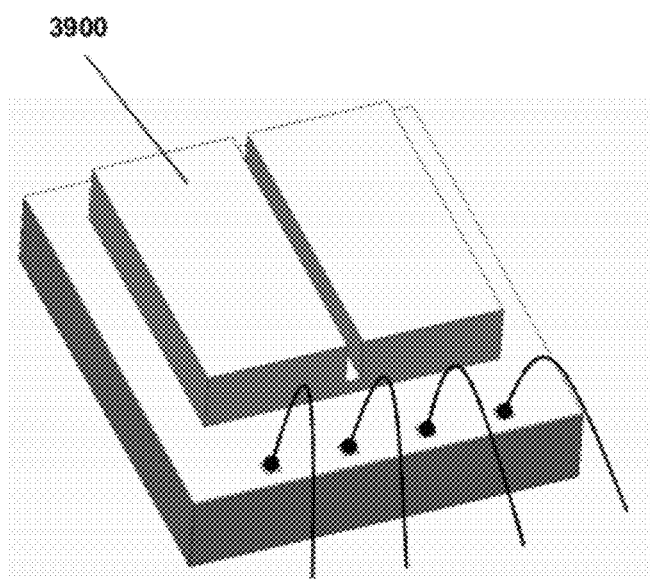
FIG. 39 is a perspective view of a current sensor comprising a copper block according to an embodiment.

In another embodiment of a coreless magnetic current sensor depicted in FIG. 39, clip 100 is replaced with a copper block 3900. Embodiments comprising copper block 3900 can present advantages, including having a low resistance, being positionable close to the magnetic sensor elements while spaced apart from the sawing edge of the die, and being relatively inexpensive to manufacture, in part because of compatibility with conventional semiconductor fabrication technologies.

Figure 40:
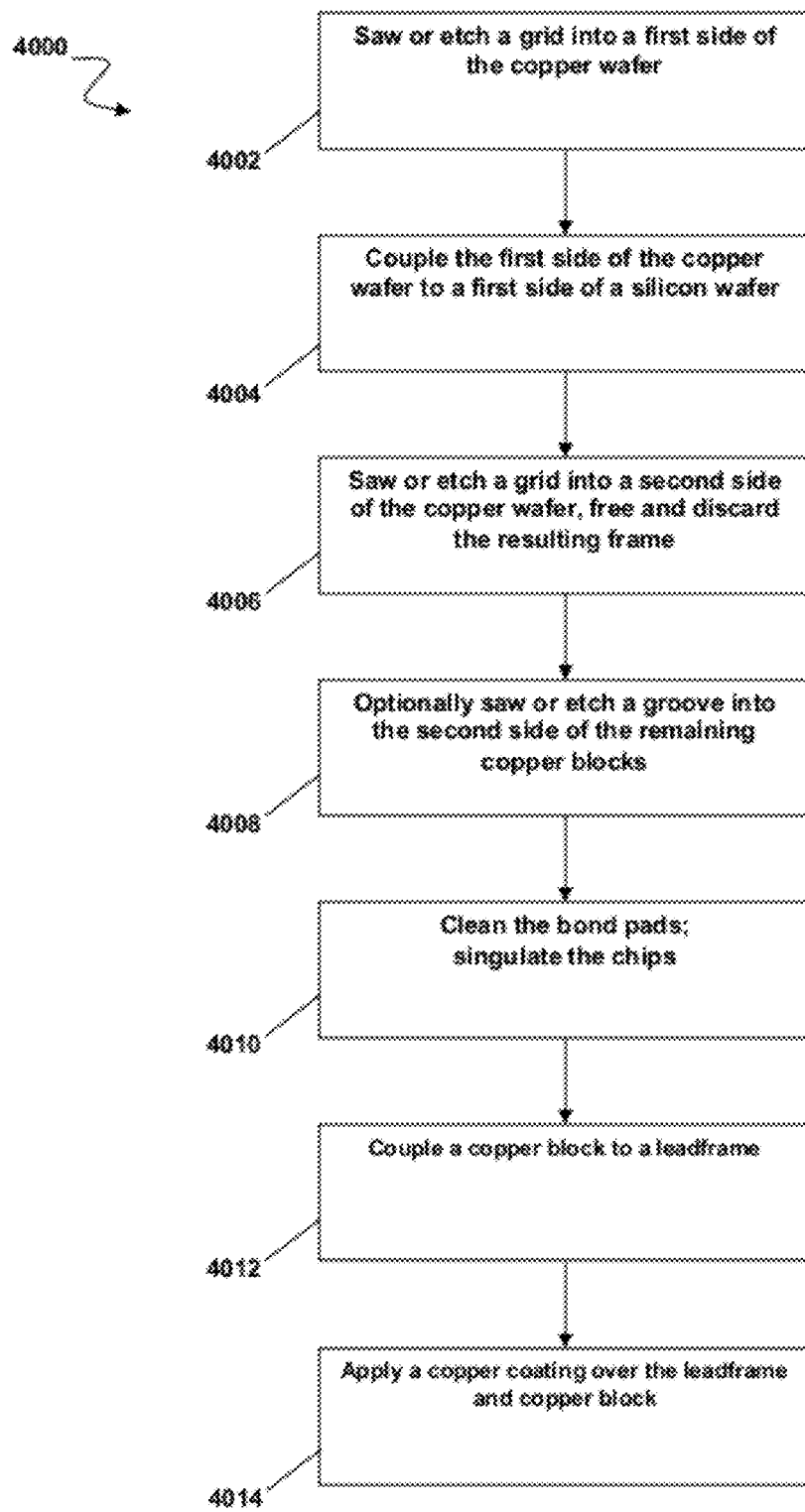
FIG. 40 is a flowchart of a process for manufacturing a current sensor comprising a copper block according to an embodiment.

FIG. 40 depicts a process 4000 for manufacturing embodiments of copper block 3900. In an embodiment, a copper wafer about 400 μm thick is used.

At 4002, a grid of grooves is formed in a first side of the copper wafer. In embodiments, the grooves are formed by etching or sawing. For a 400 μm-thick wafer, the grooves can be about 100 μm deep.

At 4004, the first side of the copper wafer, now grooved, is coupled to a silicon wafer. In embodiments, the copper wafer is coupled to the silicon wafer by soldering, gluing or some other suitable means. The silicon wafer can include an isolation layer, onto which the copper block is coupled, in embodiments. In one embodiment, the isolation layer comprises silicon oxide and is about 12 μm thick.

At 4006, a grid of grooves is formed in the second side of the copper wafer. In an embodiment in which the copper wafer is 400 μm thick, the grooves are 300 μm deep and align with the first grid of grooves formed in the first side of the copper wafer such that a frame structure can be released and discarded, leaving behind an array of spaced-apart copper blocks on the surface of the silicon wafer. In an embodiment, each copper block is about 1.9 mm by about 1.9 mm by about 0.4 mm, though these dimensions can vary in other embodiments.

At 4008, grooves are optionally formed in the remaining copper blocks. Such grooves, about 300 μm deep and about 100 μm wide in an embodiment but having other depths in other embodiments, can be helpful to increase current density in low current applications. The grooves are formed by a sawing blade in an embodiment.

In an embodiment, 4006 and 4008 can be combined, such as if there is no need to keep a lateral distance between copper block 3900 and the sawing edge of the die. This can be suitable for embodiments having low voltage isolation requirements.

Figure 41:
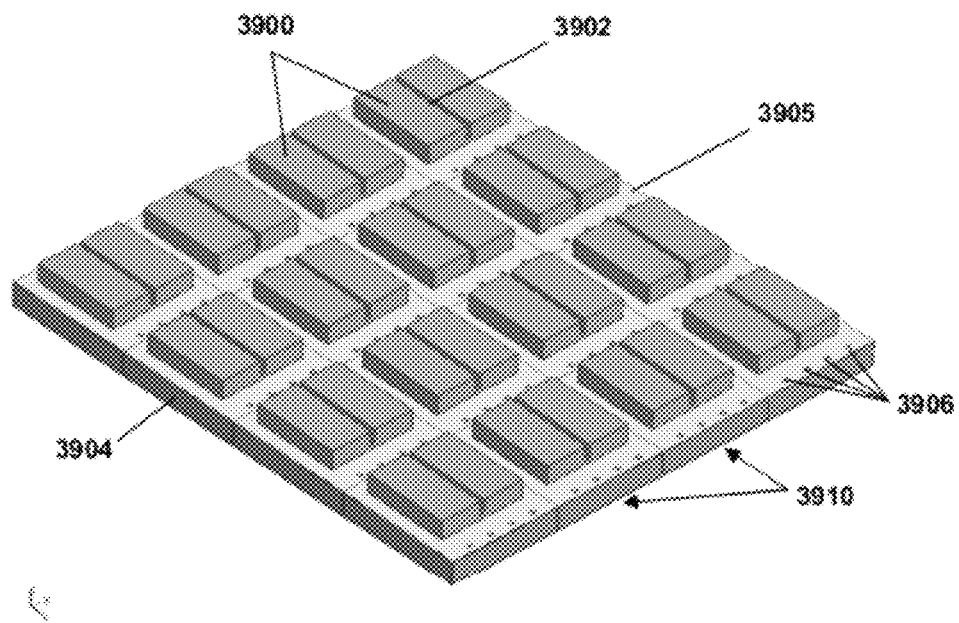
FIG. 41 is a perspective view of copper blocks mounted on a piece of silicon wafer prior to singulation according to an embodiment.

At this point, the structure is as is depicted in FIG. 41 in an embodiment, with a plurality of copper blocks 3900 having grooves 3902 mounted on a silicon wafer 3904. An isolation layer 3905 is formed on wafer 3904.

At 4010, bond pads 3906 (FIG. 41) can be cleaned and the individual chips 3910 singulated. This can be carried out in one or multiple steps, the particular sequence depicted in FIG. 40 being but one non-limiting embodiment. After singulation, each chip or die 3910 is about 2.8 mm by about 2.5 mm by about 0.5 mm in an embodiment, and each copper block 3900 has a nominal perimeter of about 300 μm of clearance to the edge of isolation layer 3905, either to the sawing edge of die 3910 or the bond wires (FIG. 39), with a strip reserved for bond pads 3906. In an embodiment, the strip is about 200 μm.

Figure 44A:
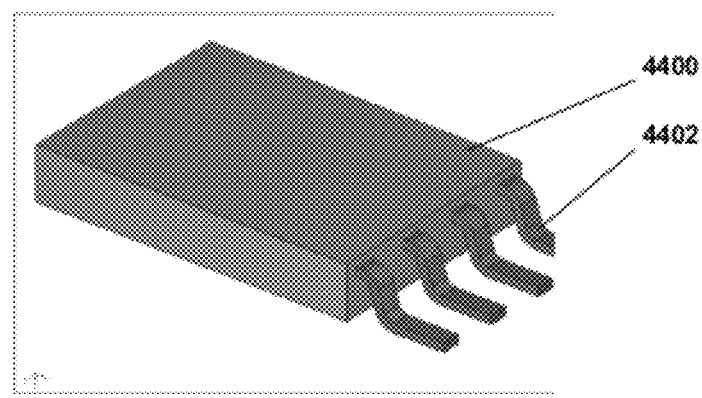
FIG. 44A depicts a top view of a current sensor package according to an embodiment.
Figure 44B:
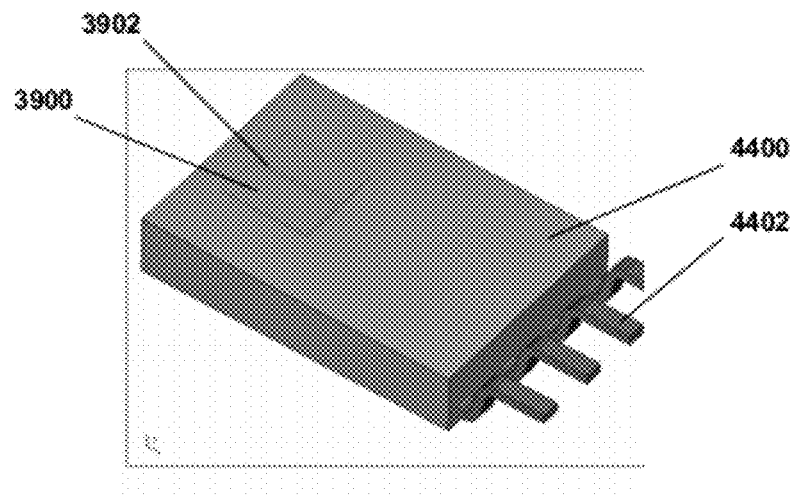
FIG. 44B depicts a bottom view of the current sensor package of FIG. 44A.
Figure 44C:
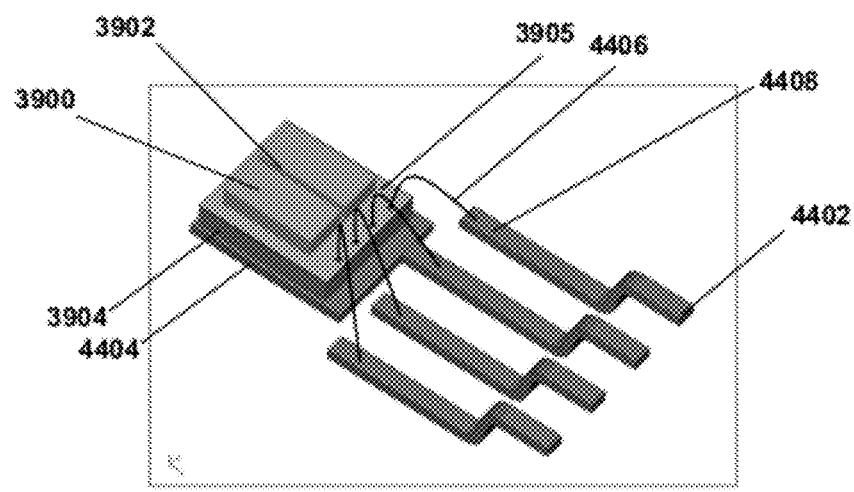
FIG. 44C depicts sensor components of the sensor of FIGS. 44A and 44B.

The embodiment depicted in FIG. 39 can be a part of a complete sensor, such as is shown in FIG. 44C, with a top surface left exposed out of a package. Such an embodiment is suitable for currents up to about 30 A but can be limited above that range because of electromigration issues.

Figure 42:
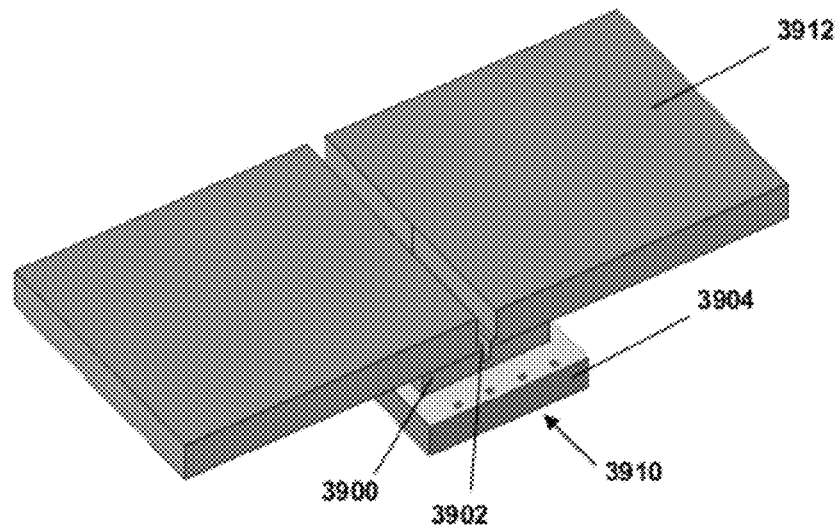
FIG. 42 is view of a copper block coupled to a silicon die and a conductor according to an embodiment.

At 4012, copper block 3900 can be coupled to a leadframe 3912, such as is depicted in FIG. 42. Leadframe 3912 can be about 0.4 mm thick in an embodiment. Coupling can be effected by gluing, soldering or other suitable means. For example, in an embodiment copper block 3900 is coupled to leadframe 3912 by about a layer of conductive paste or die attach that is about 10 μm thick.

At 4014, a copper coating can be applied over leadframe 3912 and copper block 3900. In one embodiment, a copper coating about 50 μm thick is uniformly galvanized over leadframe 3912 and copper block 3900. The copper coating reduces the distance between block 3900 and the sawing edge of silicon die 3910 and bond pads 3906 by about 50 μm in each direction, while leadframe 3912 becomes about 100 μm thicker. The depth and width of groove 3902 are also reduced.

Figure 43:
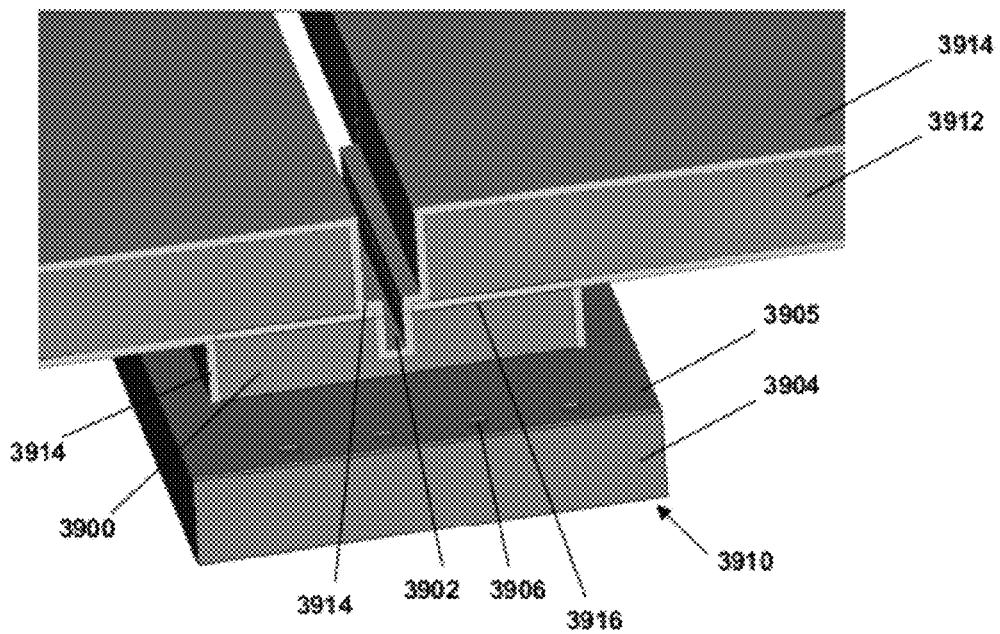
FIG. 43 is a partial side sectional view of sensor components according to an embodiment.

FIG. 43 depicts an enlarged partial cross-sectional view of the structure of FIG. 42, with copper coating shown at 3914. Solder 3916 between copper block 3900 and leadframe 3912 affixes one to the other prior to galvanization but is not necessary for current transport because electrical contact is made by copper coating 3914. Solder 3916 therefore does not affect electromigration.

In another embodiment, copper block 3900 can comprise two distinct portions, if groove 3902 is carried through block 3902. A metal layer, such as aluminum or power copper, can be formed below and, if in contact with block 3902, also galvanized, including in between the portions of block 3900. In this embodiment, arbitrary thin layers can be grown and also patterned laterally as desired.

Advantages of embodiments and process 4000 include the ability to produce structures more accurately and cheaply than conventional solutions, in part because the whole silicon wafer can be used and the structures can be formed more accurately at the wafer level. In particular, precise position tolerances can be achieved.

Other variations are also possible in embodiments. For example, the copper blocks can be coupled to the front side, back side or both sides of the wafer. The top sides of the copper blocks can be prepared for soldering, though electromigration can then become a current limiter. Large contacts forming part of the leadframe can be coupled, such as by soldering, to top side of the copper block. This can be carried out during package assembly. If diffusion soldering is used, the solder junction can then tolerate higher current density, such as up to about 60 A. Large contacts can also be coupled by a conductive glue or other solder and coated at least partially to ensure good electrical contact with the copper block, such as in a galvanic bath. In embodiments, the coating is about 10 µm to about 50 µm thick and comprises a good conductor, such as copper.

As previously mentioned, copper block 3900 can be substituted for clip 100. Thus, embodiments for current sensing applications comprising copper block 3900 can also comprise at least one magnetic field sensor. Embodiments can also comprise amplifiers and signal conditioning circuitry. The magnetic field sensors can comprise planar Hall plates, which can be disposed near a straight or curved edge of the copper block and near the part of the copper block having the smallest cross-sectional area (and therefore highest current density).

Following 4008, the die can instead be coupled, such as by gluing, to a die paddle or a leadframe, with connections then made between leads and bond pads with bond wires and mold compound applied.

An example embodiment is depicted in FIG. 44. FIG. 44A is a top view of the mold body 4400 and sensor leads 4402. FIG. 44B is a bottom view of mold body 440 and leads 4402, with copper block 3900 visible. FIG. 44C omits the mold body such that die 3904 and die paddle 4404 can be seen, as well as bond wires 4406 coupling bond pads 3906 to leadframe 4408.

In FIG. 44B, it can be seen that groove 3902 is filled with mold compound to avoid shorts when the contacts (exposed surfaces of block 3900) are soldered to busbars, PCBs, or other structures. In an embodiment, groove 3902 can be made wider at the surface of the package by first forming groove 3902 with a thick blade and then sawing deeper with a thin blade. Groove 3902 can also be formed by etching and then sawing (or in reverse order), in another embodiment.

Figure 45A:
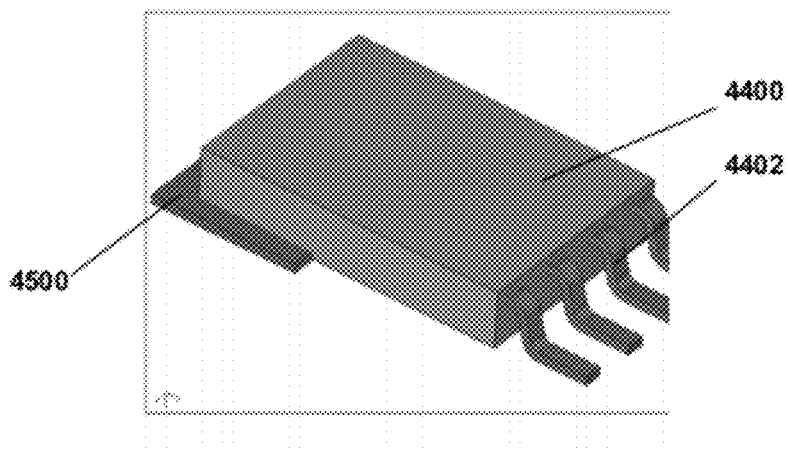
FIG. 45A depicts a top view of a current sensor package according to an embodiment.
Figure 45B:
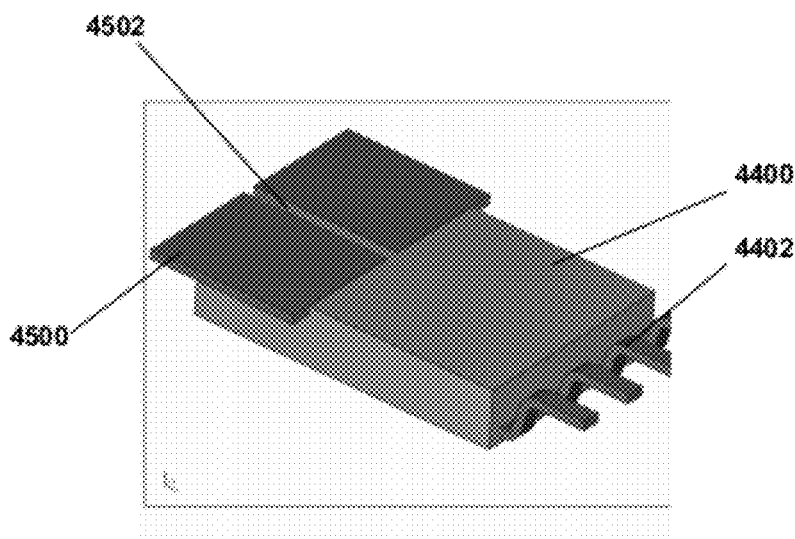
FIG. 45B depicts a bottom view of the current sensor package of FIG. 45A.
Figure 45C:
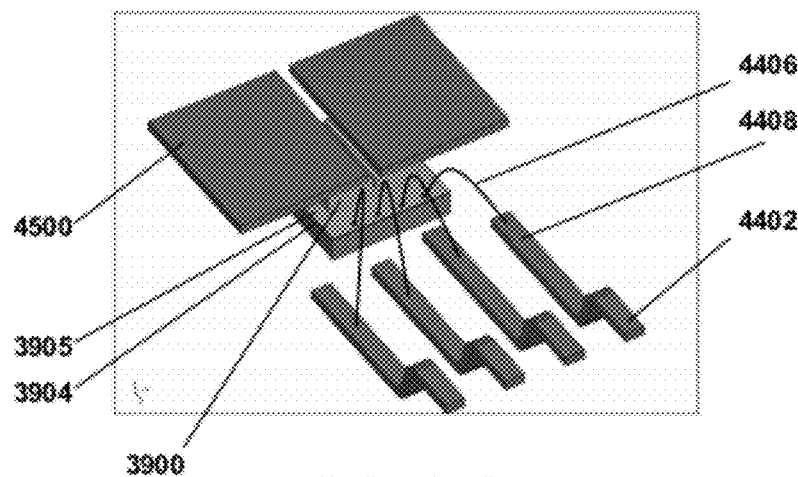
FIG. 45C depicts sensor components of the sensor of FIGS. 45A and 45B.

FIG. 45 depicts another embodiment, in which large contacts are coupled to the copper block. Similar to FIG. 44, FIG. 45A is a top view, FIG. 45B is a bottom view, and FIG. 45C omits the mold body. Large contacts 4500 can be part of the leadframe in an embodiment, such that a separate die paddle is not necessary. This can increase the bandwidth of the sensor in embodiments. If contacts 4500 are coupled by a soldering technique having a high melting point, such as diffusion soldering, the electromigration limit of the solder junction is also higher than that of the embodiment of FIG. 44. Similar to the embodiment of FIG. 44, the gap 4502 between the contacts 4500 is filled with mold compound to avoid shorts, though the portion of gap 4502 extending beyond mold body 4400 can be unfilled if the gap width is sufficient.

Referring to FIG. 45C, the height of bond wires 4406 is as low as possible in embodiments to the keep the distance between contacts 4500 and the surface of mold body 4400 larger. Therefore, in one embodiment wires 4406 are bent downwards so that their top point is about the same height as the bond pads on die 3904.

The thickness of contacts 4500 can be similar to that of sensor leads 4402, which can reduce the price of leadframe 4408. In an embodiment, leadframe comprises copper with a very low, such as less than 0.1%, iron content. An advantage of copper block 3900, however, is that it can be made of high purity copper, which has a low resistivity, in order to reduce the dissipation and self-heating of the sensor.

As previously mentioned in various contexts and with respect to various embodiments discussed herein throughout, the distance between the conductor and the magnetic field sensor(s) is also important, as is the fact that this distance remain stable over the lifetime of the sensor. Conventional solutions often use thin conductor layers manufactured during semiconductor fabrication, which have well-defined positions and are generally stable over lifetime. Thin conductors, however, are current limiters. Other conventional solutions for higher current applications fix the conductor to the die using an adhesive, glue, mold compound or other material. While such configurations can handle higher currents, the fixing materials are less stable, susceptible to moisture, chemical reactions from long-term exposure to high temperatures and other factors that can alter the material thickness and thereby affect sensor accuracy.

Therefore, embodiments can utilize soldering techniques to couple the primary conductor and semiconductor die, for example in high current applications in which a massive conductor is used. In embodiments, solder is not used to carry current but establishes a mechanical connection between the conductor and the semiconductor die having the magnetic field sensor elements, with current flowing in the conductor. The relative position of the conductor with respect to the magnetic field sensor element(s) is therefore determined only by anorganic, highly stable materials such as semiconductors, metal, ceramic, glass, porcelain, solder and the like.

Figure 46A:
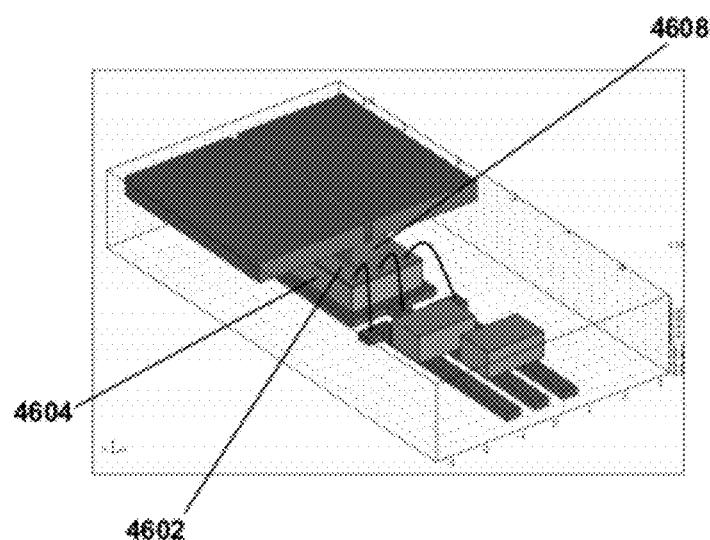
FIG. 46A is a perspective view of sensor components according to an embodiment.
Figure 46B:
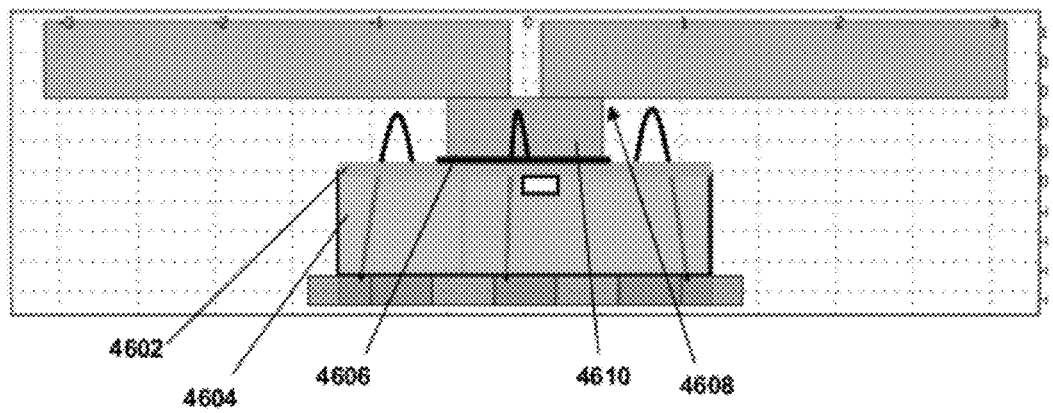
FIG. 46B is a semi-transparent side sectional view of sensor components of FIG. 46A.

Referring to FIG. 46, in one embodiment an insulating layer 4602 is formed on a semiconductor die 4604. Insulating layer 4602 is inorganic in embodiments and can comprise silicon oxide, nitride or some other suitable material. A metal layer 4606 (FIG. 46B) is formed on insulating layer 4602 and can comprise copper, aluminum or some other suitable material. Metal layer 4606 can be formed and/or prepared such that it is solderable, for example solderable to a metal part in a package assembly process. Both insulating layer 4602 and metal layer 4606 can be formed during front-end semiconductor manufacturing in an embodiment.

After the individual semiconductor dies 4604 are singulated during manufacturing, the dies 4604 can each be soldered to a primary conductor 4608 at metal layer 4606. In the embodiment depicted in FIG. 46, conductor 4608 comprises a clip. The clip can comprise a single metal piece or other configurations, such as are discussed herein above. In other embodiments, conductor 4608 can comprise other configurations, such as the copper block discussed herein above. Therefore, the particular configuration of the clip will not be discussed in detail here, with reference instead made to the discussion herein above regarding various embodiments.

Referring in particular to FIG. 46B, insulating layer 4602 and metal layer 4606 can be seen. Insulating layer 4602 can be both insulating and inorganic, with inorganic being beneficial to avoid moisture absorption or otherwise alter its composition or dimensions. In embodiments, insulating layer 4602 comprises silicon dioxide, nitride or some other suitable material. Metal layer 4606 is positioned on insulating layer 4602 such that layer 4606 does not contact die 4604 and is electrically floating. In an embodiment, metal layer 4606 comprises aluminum, copper or some other suitable material and has been finished such that layer 4606 is solderable. Similar to clip embodiments discussed herein above, a footprint portion 4610 of conductor 4608 is mechanically coupled to die 4604 by soldering at metal layer 4606. In embodiments, conductor 4608 is smaller than metal layer 4606 and metal layer 4606 is sufficiently thick to avoid damage or other effects from possible manufacturing results including burrs on conductor 4608.

Figure 47:
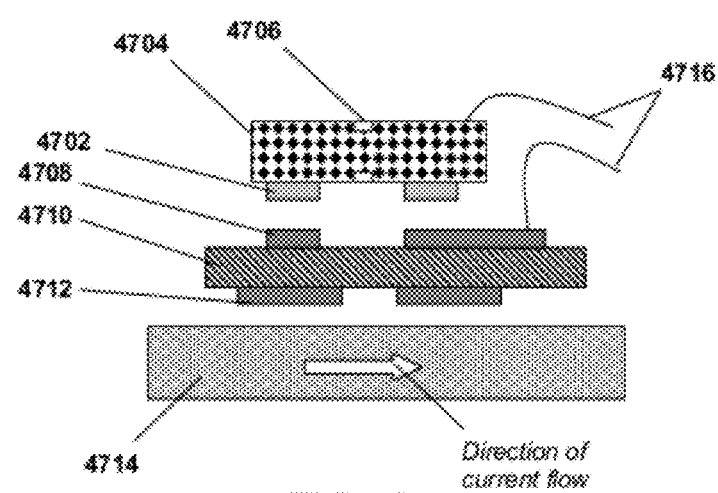
FIG. 47 is a side sectional view of sensor components according to an embodiment.

Another embodiment is depicted in FIG. 47, in which part of a surface of the semiconductor die is covered by a metal plate or layer that does not need to be electrically isolated from the die. FIG. 47 is a partially exploded view for convenience of illustration. In the embodiment of FIG. 47, solderable metal plates 4702 are coupled to a surface of die 4704, which includes magnetic field sensor elements 4706 on a top or bottom side of die 4704. The metal plates 4702 are configured to be coupled to metal plates 4708 coupled to a surface of an insulating plate 4710. Insulating plate 4710 is in turn coupled to a current rail or conductor 4714 by metal plates 4712. Bond wires 4716 can be coupled directly to die 4704 via bond pads and/or indirectly to die 4704 by traces on a top surface of plate 4710 and then to leads of a leadframe (not depicted in FIG. 47).

In embodiments, insulating plate 4710 comprises ceramic, glass, porcelain, silicon or some other suitable material. Insulating plate 4710 can be larger than die 4704 and therefore can also provide more reliable voltage isolation. Additionally, plate 4710 need not be perfectly flat in embodiments, as plate 4710 can be profiled by etching or some other technique such that the perimeter area or a portion thereof is thicker or thinner than the center area. For example, in an embodiment in which die 4704 rests in the center of plate 4710, a thicker perimeter portion of plate 4710 can provide increased voltage isolation. In such an embodiment, metal layer 4708 should not extend to the thicker perimeter portion.

In one embodiment of FIG. 47, metal layers 4702 are positioned at a back side of die 4704, and the electronic devices, such as magnetic field sensor elements 4706, are on the opposite, front side of die 4704. Die 4704 can then be coupled to by bond wires 4716 via bond pads on the front side. In another embodiment, metal layers 4702 are at the front side of die 4704, as are the electronic devices, such as magnetic field sensor elements 4706, and die 4704 is flip-chip mounted on insulating plate 4710. Contacts can be made via fine conductive traces 4708 and bond wires 4716 to die 4704.

Metal plates or layers 4702, 4708 and 4712 are prepared to be solderable and, during manufacturing, the soldering of these layers 4702, 4708 and 4712 can be carried out in a single step or in multiple steps. For example, it can be desired in an embodiment to solder consecutively, using different solder processes at different temperatures. In embodiments, high-temperature soldering, such as diffusion soldering, can be used, which is advantageous because it can be thin and subsequently the package contacts can be readily solderable at a lower temperature with conductor 4714 remaining stable with respect to the position of die 4704.

In embodiments, conductor 4714 can comprise a unitary or plurality of components, for example a clip and leads. At the surface of die 4704, however, conductor 4714 comprises a single part.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A magnetic field current sensor comprising:
 a semiconductor die having a first surface and a second surface, the first surface and the second surface opposing one another, and comprising at least one magnetic field sensing element; and
 a unitary conductor configured to carry current to be sensed by the at least one magnetic field current sensor and comprising a footprint portion, a first pillar portion, a second pillar portion, a first contact portion, and a second contact portion, the first pillar portion having a first height and coupling the first contact portion to the footprint portion, the second pillar portion having the first height and coupling the second contact portion to the footprint portion, the first height being a monotonic vertical dimension separating the footprint portion from the first contact portion and the second contact portion, and the footprint portion coupling the conductor to the first surface of the semiconductor die such that the footprint portion is substantially parallel to the first surface of the semiconductor die and within a perimeter of the first surface, and the first contact portion and the second contacts portion are closer to the first surface than the second surface, wherein the unitary conductor is configured to carry current between the first contact portion and the second contact portion.

2. The magnetic field current sensor of claim 1, wherein the conductor comprises at least one notch formed in the footprint portion.

3. The magnetic field current sensor of claim 2, wherein an end of the notch has a radius.

4. The magnetic field current sensor of claim 2, wherein the notch is about 0.3 mm wide and about 0.5 mm long.

5. The magnetic field current sensor of claim 2, wherein a width of the notch is equal to or greater than a thickness of the conductor.

6. The magnetic field current sensor of claim 1, wherein an edge of the footprint portion is separated from the perimeter of the first surface of the semiconductor die by a distance in the range of about 0.1 mm to about 1 mm.

7. The magnetic field current sensor of claim 1, wherein the first pillar portion and the second pillar portion are approximately perpendicular to the footprint portion, the first contact portion and the second contact portion.

8. The magnetic field current sensor of claim 1, wherein the footprint portion couples the conductor to the first surface of the semiconductor die such that the first contact portion and the second contact portion extend beyond the perimeter of the first surface of the semiconductor die, separated by a vertical distance.

9. The magnetic field current sensor of claim 1, wherein an area of a surface of the footprint portion coupling the footprint portion to the first surface is at least about 25% of an area of the first surface.

10. The magnetic field current sensor of claim 1, further comprising an isolation layer between the footprint portion and the first surface of the semiconductor die.

11. The magnetic field current sensor of claim 1, wherein the footprint portion is coupled to the first surface by one of an adhesive or a solder paste.

12. The magnetic field current sensor of claim 1, wherein the conductor is formed from a sheet metal.

13. The magnetic field current sensor of claim 12, wherein the sheet metal has a constant thickness in a range of about 0.1 mm to about 0.6 mm.

14. The magnetic field current sensor of claim 1, wherein the at least one magnetic field sensing element is proximate the first surface of the semiconductor die.

15. The magnetic field current sensor of claim 1, wherein the at least one magnetic field sensing element is proximate the second surface of the semiconductor die.

16. The magnetic field current sensor of claim 1, wherein a cross-sectional area of the footprint portion is smaller than a cross-sectional area of the first contact portion or the second contact portion.

17. The magnetic field current sensor of claim 1, further comprising a package enclosing the semiconductor die and conductor.

18. The magnetic field current sensor of claim 1, wherein the at least one magnetic field sensing element is configured to sense a magnetic field induced by the current carried by the conductor.

* * * * *